US010580462B2

(12) United States Patent
Kim

(10) Patent No.: US 10,580,462 B2
(45) Date of Patent: Mar. 3, 2020

(54) MEMORY DEVICE, MEMORY SYSTEM AND ELECTRONIC DEVICE

(71) Applicant: Samsung Electronics Co., Ltd., Suwon-si, Gyeonggi-do (KR)

(72) Inventor: Chankyung Kim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/129,948

(22) Filed: Sep. 13, 2018

(65) Prior Publication Data

US 2019/0252005 A1 Aug. 15, 2019

(30) Foreign Application Priority Data

Feb. 14, 2018 (KR) .................. 10-2018-0018233

(51) Int. Cl.
| | |
|---|---|
| G11C 8/00 | (2006.01) |
| G11C 5/06 | (2006.01) |
| G11C 8/18 | (2006.01) |
| G11C 8/14 | (2006.01) |
| G11C 5/02 | (2006.01) |

(52) U.S. Cl.
CPC .............. *G11C 5/063* (2013.01); *G11C 5/025* (2013.01); *G11C 8/14* (2013.01); *G11C 8/18* (2013.01)

(58) Field of Classification Search
CPC ... G11C 17/16; G11C 13/004; G11C 13/0004; G11C 13/0007; G11C 13/003; G11C 17/18; G11C 2213/72; G11C 2213/74; G11C 13/0002; G11C 29/027; G11C 7/22; G11C 13/0011

USPC .... 365/96, 148, 226, 158, 163, 100, 189.09, 365/227, 173, 189.07, 190, 203, 63, 149, 365/177, 189.16, 194
See application file for complete search history.

(56) References Cited

U.S. PATENT DOCUMENTS

| | | | |
|---|---|---|---|
| 5,894,448 A | | 4/1999 | Amano et al. |
| 7,180,949 B2 | | 2/2007 | Kleveland et al. |
| 7,190,192 B2 | | 3/2007 | Haq |
| 7,738,311 B2 | | 6/2010 | Youn et al. |
| 9,437,586 B2 | | 9/2016 | Hong |
| 2002/0008254 A1* | | 1/2002 | Noda .................. G11C 5/025 257/203 |
| 2007/0206419 A1 | | 9/2007 | Makino |

FOREIGN PATENT DOCUMENTS

| | | |
|---|---|---|
| JP | 5131816 B2 | 1/2013 |
| KR | 10-0855586 B1 | 9/2008 |
| KR | 10-0914930 B1 | 9/2009 |

* cited by examiner

*Primary Examiner* — Thong Q Le
(74) *Attorney, Agent, or Firm* — Harness, Dickey & Pierce, P.L.C.

(57) ABSTRACT

A memory device includes a memory cell array that a plurality of memory cells, an edge buffer circuit that is placed in a first region adjacent to one side of the memory cell array and receives an external signal from the outside through a pad, and a middle buffer circuit that is placed in a second region adjacent to an opposite side of the memory cell array and receives a differential small-swing signal corresponding to the external signal from the edge buffer circuit through first and second signal lines above the memory cell array. The edge buffer circuit drives the first and second signal lines based on the external signal such that the differential small-swing signal is transmitted to the middle buffer circuit.

13 Claims, 15 Drawing Sheets

FIG. 5

MEMORY DEVICE, MEMORY SYSTEM AND ELECTRONIC DEVICE

CROSS-REFERENCE TO RELATED APPLICATIONS

This U.S non-provisional application claims priority under 35 U.S.C. § 119 to Korean Patent Application No. 10-2018-0018233 filed on Feb. 14, 2018, in the Korean Intellectual Property Office, the disclosure of which is incorporated by reference herein in their entireties.

BACKGROUND

Various example embodiments of the inventive concepts described herein relate to a semiconductor memory device, and more particularly, relate to a memory device, a memory system, and an electronic device, which may transmit a signal at a high speed.

Semiconductor memory devices are classified into volatile memory devices, which lose data stored therein at power-off, such as a static random access memory (SRAM), a dynamic RAM (DRAM), and a synchronous DRAM (SDRAM), and nonvolatile memory devices, which retain data stored therein even at power-off, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

Nowadays, the demand on an increased capacity of a semiconductor memory is increasing. For example, the capacity of a semiconductor memory device may be increased by stacking a plurality of semiconductor memory devices. Wire bonding may be used to connect the stacked semiconductor memory devices. In this case, a high-speed interface may be required to transmit a signal received through a pad to a logic circuit located at the center of a memory device through a memory cell array. However, in the case where a circuit for signal transmission is added to the memory cell array, the area of the memory device may increase.

SUMMARY

Various example embodiments of the inventive concepts provide a memory device, a memory system, and/or an electronic device, which may transmit a signal at a high speed without increasing the area of the memory device, in the memory device connected through wire bonding.

According to an aspect of at least one example embodiment, a memory device includes a memory cell array that a plurality of memory cells, an edge buffer circuit that is placed in a first region adjacent to one side of the memory cell array and receives an external signal from the outside through a pad, and a middle buffer circuit that is placed in a second region adjacent to an opposite side of the memory cell array and receives a differential small-swing signal corresponding to the external signal from the edge buffer circuit through first and second signal lines above the memory cell array. The edge buffer circuit drives the first and second signal lines based on the external signal such that the differential small-swing signal is transmitted to the middle buffer circuit.

According to another aspect of at least one example embodiment, a memory system includes a first memory device, and a second memory device that is stacked on the first memory device and is connected with the first memory device through a wire bonding. At least one of the first memory device or the second memory device includes a memory cell array that includes a plurality of memory cells, an edge buffer circuit that is placed in a first region adjacent to one side of the memory cell array and receives an external signal, and a middle buffer circuit that is placed in a second region adjacent to an opposite side of the memory cell array and receives a differential small-swing signal corresponding to the external signal from the edge buffer circuit through first and second signal lines above the memory cell array. The edge buffer circuit drives the first and second signal lines based on the external signal such that the differential small-swing signal is transmitted to the middle buffer circuit.

According to another aspect of at least one example embodiment, an electronic device includes a driver that receives a signal, and a receiver that receives a differential small-swing signal corresponding to the signal from the driver through first and second signal lines. The driver includes a phase splitter that generates a first signal, a phase of which is identical to a phase of the signal, and a second signal, a phase of which corresponds to an inverted phase of the signal, based on the signal, and a push-pull driver that adjusts a voltage magnitude of a first output node and a voltage magnitude of a second output node based on the first and second signals, to output the differential small-swing signal. The first output node is connected with one end of the first signal line, and second output node is connected with one end of the second signal line.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 5 is a diagram illustrating an example circuit of a driver of FIG. 4.

DETAILED DESCRIPTION

Below, example embodiments of the inventive concepts may be described in detail and clearly to such an extent that a person ordinarily skilled in the art easily implements the inventive concepts.

Figure 1:
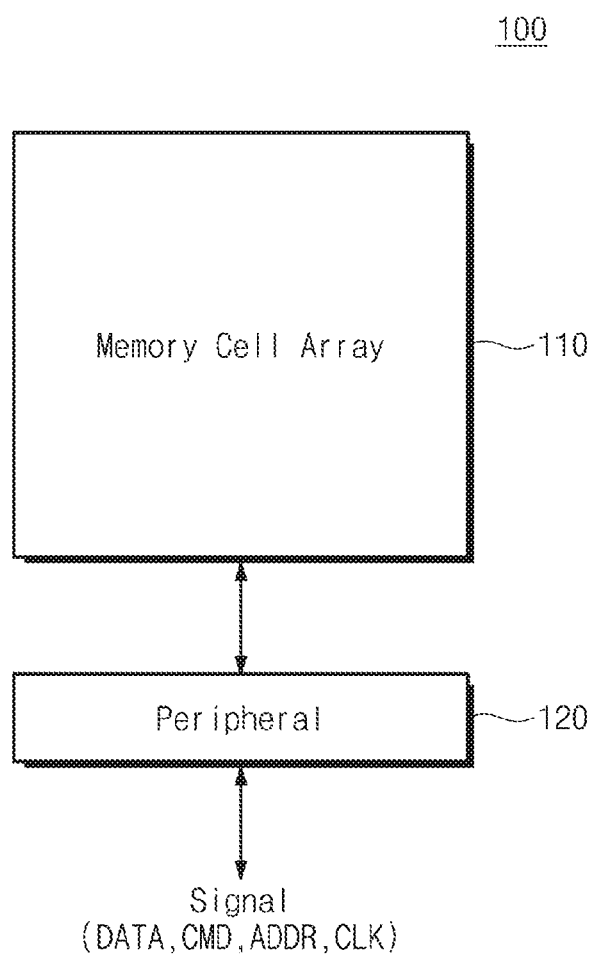
FIG. 1 is a block diagram illustrating a memory device according to at least one example embodiment.

FIG. 1 is a block diagram illustrating a memory device according to at least one example embodiment. Referring to FIG. 1, a memory device 100 may include a memory cell array 110 and a peripheral circuit 120. In some example embodiments, the memory device 100 may include at least one of volatile or nonvolatile memories such as a static random access memory (SRAM), a dynamic RAM (DRAM), a synchronous DRAM (SDRAM), a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

The memory cell array 110 may include a plurality of memory cells. The memory cells may be connected to each other through word lines.

The peripheral circuit 120 may receive a signal from the outside and may control the memory cell array 110 in response to the received signal. For example, the peripheral circuit 120 may receive signals, such as data "DATA", a command CMD, an address ADDR, and a clock CLK, from the outside. The memory cell array 110 and the peripheral circuit 120 may perform operations based on the clock CLK. The peripheral circuit 120 may receive the command CMD, the address ADDR, and the data "DATA" and may store the data "DATA" in the memory cell array 110. The peripheral circuit 120 may receive the command CMD and the address ADDR and may read data "DATA" from the memory cell array 110.

The peripheral circuit 120 may include buffer circuits which transmit a signal input from the outside to any other components of the peripheral circuit 120, a logic circuit which controls overall operations of the memory device 100, and an address decoder which decodes the address ADDR and provides an operation voltage to the memory cell array 110 based on the decoded address. Circuits included in the peripheral circuit 120 are not limited thereto. For example, the peripheral circuit 120 may include various circuits such as a page buffer circuit and an input/output circuit.

The peripheral circuit 120 may receive a signal from the outside through a pad. The peripheral circuit 120 may transmit signals received through the buffer circuits to various circuits included in the peripheral circuit 120. The peripheral circuit 120 may transmit a signal provided from the memory cell array 110 or a signal generated by the peripheral circuit 120 to the outside. The peripheral circuit 120 may transmit a signal to the outside through a pad by using the buffer circuits. In some example embodiments, the peripheral circuit 120 may convert a signal to a differential small-swing signal for the purpose of transmitting signals between various circuits included in the peripheral circuit 120. The differential small-swing signal may include a first voltage signal and a second voltage signal, which vary with a width of a small magnitude as a signal value to be transmitted varies. The first voltage signal and the second voltage signal which are differential signals to be transmitted through two different signal lines may oppositely vary with a change in a signal value to be transmitted. A receiver unit may receive the differential small-swing signal through two nodes and may restore a signal based on the received differential small-swing signal.

Figure 2:
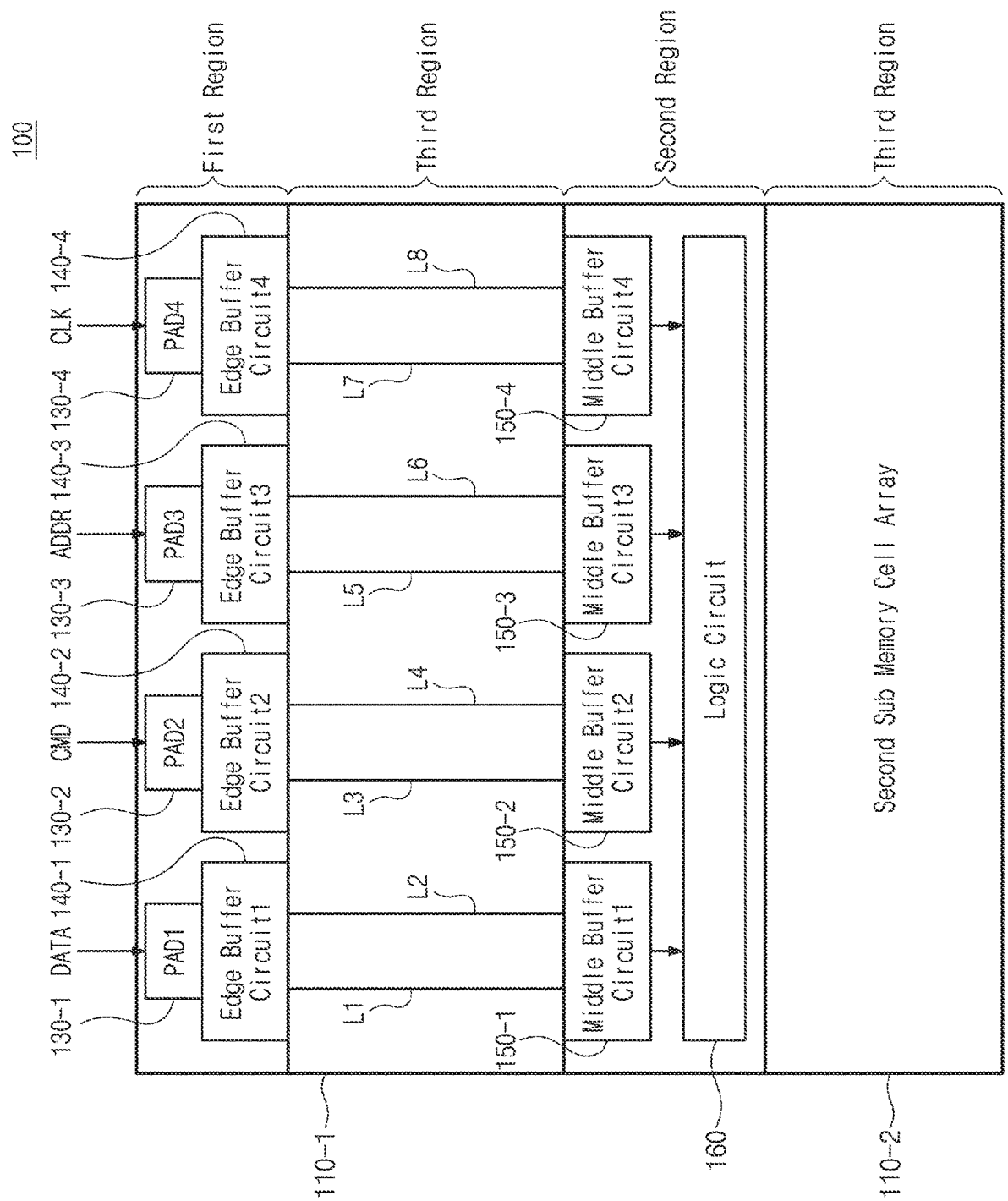
FIG. 2 is a block diagram illustrating a memory device of FIG. 1.

FIG. 2 is a block diagram illustrating a memory device of FIG. 1. Referring to FIG. 2, the memory device 100 may include a plurality of pads 130-1 to 130-4, a plurality of edge buffer circuits 140-1 to 140-4, the memory device 100, a plurality of middle buffer circuits 150-1 to 150-4, and/or a logic circuit 160. The memory cell array 110 may include a first sub memory cell array 110-1 and a second sub memory cell array 110-2. The peripheral circuit 120 of FIG. 1 may include the plurality of pads 130-1 to 130-4, the plurality of edge buffer circuits 140-1 to 140-4, the plurality of middle buffer circuits 150-1 to 150-4, and/or the logic circuit 160.

The memory device 100 may be divided into a first region, a second region, and third regions. The plurality of pads 130-1 to 130-4 and the plurality of edge buffer circuits 140-1 to 140-4 may be placed in the first region. The first region may be placed at a periphery of the memory device 100. The plurality of middle buffer circuits 150-1 to 150-4 and the logic circuit 160 may be placed in the second region. The second region may be placed at the center of the memory device 100. The first sub memory cell array 110-1 and the second sub memory cell array 110-2 may be placed in the third regions. In detail, the first region may be a region which is adjacent to one side of the first sub memory cell array 110-1, and the second region may be a region which is interposed between the third regions and is adjacent to an opposite side of the first sub memory cell array 110-1.

The memory device 100 may receive the data "DATA", the command CMD, the address ADDR, and the clock CLK from the outside through the plurality of pads 130-1 to 130-4. For example, as shown in the FIG. 2, the memory device 100 may receive the data "DATA" through the first pad 130-1. The memory device 100 may receive the command CMD through the second pad 130-2. The memory device 100 may receive the address ADDR through the third pad 130-3. The memory device 100 may receive the clock CLK through the fourth pad 130-4.

An edge buffer circuit corresponding to each pad may transmit the received signal to a middle buffer circuit in the second region. The first edge buffer circuit 140-1 may transmit the data "DATA" received through the first pad 130-1 to the first middle buffer circuit 150-1. Likewise, the second edge buffer circuit 140-2 to the fourth edge buffer circuit 140-4 may transmit the command CMD, the address ADDR, and the clock CLK to the second middle buffer circuit 150-2 to the fourth middle buffer circuit 150-4, respectively. The signals transmitted to the plurality of middle buffer circuits 150-1 to 150-4 may be transmitted to the logic circuit 160. The logic circuit 160 may control overall operations of the memory device 100 based on the transmitted signals.

Below, for convenience of description, the operations of the plurality of edge buffer circuits 140-1 to 140-4 and the operations of the plurality of middle buffer circuits 150-1 to 150-4 will be described with reference to the first edge buffer circuit 140-1 and the first middle buffer circuit 150-1.

The first edge buffer circuit 140-1 may transmit the data "DATA" to the first middle buffer circuit 150-1 by using a first signal line L1 and a second signal line L2. To transmit the data "DATA" to the first middle buffer circuit 150-1, the first edge buffer circuit 140-1 may drive the first signal line L1 and the second signal line L2 in a differential small-swing manner. That is, the first edge buffer circuit 140-1 may transmit the differential small-swing signal corresponding to the data "DATA" to the first middle buffer circuit 150-1.

A repeater or an inverter need not be included in signal transmission between the first edge buffer circuit 140-1 and the first middle buffer circuit 150-1. Alternatively, the first signal line L1 and the second signal line L2 need not include a repeater or an inverter. For example, the first signal line L1 and the second signal line L2 may be metal lines.

According to the related art, a repeater or an inverter is used to transmit a signal, which is received through a pad placed at a periphery of a memory device, to a logic circuit placed at the center of the memory device. The repeater or inverter may be used to in signal detection at the receiver unit, and power consumption may be increased to drive the repeater or inverter. In the case where the repeater or inverter is included in the third regions, the area of the memory device may be increased. Also, in the case where a signal is received through the repeater or inverter, a time needed for the signal to pass through the circuit may increase, thereby causing an increase in a delay time.

In contrast, since the first signal line L1 and the second signal line L2 do not include a separate circuit for signal transmission, the area of the third regions may not be increased. Also, since the data "DATA" are transmitted without passing through the separate circuit, the first edge buffer circuit 140-1 may transmit the data "DATA" to the first middle buffer circuit 150-1 at a high speed. Further, since the data "DATA" are transmitted without passing through the separate circuit, the first edge buffer circuit 140-1 may use less power.

The first middle buffer circuit 150-1 may receive a differential small-swing signal corresponding to the data "DATA" and may convert the received differential small-swing signal to a differential full-swing signal. The differential full-swing signal may be generated based on the differential small-swing signal. The differential full-swing signal may include a first voltage signal and a second voltage signal, which vary with a width of a large magnitude as the differential small-swing signal varies. That is, a change in a magnitude of the differential full-swing signal may be greater than a change in a magnitude of the differential small-swing signal.

The first middle buffer circuit 150-1 may restore the transmitted data "DATA" based on the differential full-swing signal. The restored data "DATA" may be transmitted to the logic circuit 160. As such, the data "DATA" transmitted through the first pad 130-1 in the first region may be transmitted to the logic circuit 160 in the second region.

At least one example embodiment in which signals received through the first to fourth pads 130-1 to 130-4 are transmitted to the logic circuit 160 in the second region is illustrated in FIG. 2. However, the inventive concepts are not limited thereto. For example, the memory device 100 may include various numbers of pads in the first region. For example, the data "DATA" are illustrated in FIG. 2 as being received through the first pad 130-1, but the data "DATA" may be received through a plurality of pads.

At least one example embodiment is illustrated in FIG. 2 as a signal received from the outside through a pad is transmitted to the logic circuit 160, but the inventive concepts are not limited thereto. In some example embodiments, a signal, which is transmitted from the memory cell array 110 to the logic circuit 160, or a signal, which is generated by the logic circuit 160, may be transmitted to the outside through a pad after passing through a middle buffer circuit in the second region and an edge buffer circuit in the first region.

For example, the first middle buffer circuit 150-1 may transmit the data "DATA", which are read from the memory cell array 110, to the first edge buffer circuit 140-1 by using the first signal line L1 and the second signal line L2. The first edge buffer circuit 140-1 may transmit the data "DATA" to the outside through the first pad 130-1. To transmit the data "DATA" to the first edge buffer circuit 140-1, the first middle buffer circuit 150-1 may drive the first signal line L1 and the second signal line L2 in a differential small-swing manner. The first edge buffer circuit 140-1 may receive a differential small-swing signal corresponding to the data "DATA" and may convert the received differential small-swing signal to a differential full-swing signal. The first edge buffer circuit 140-1 may restore the data "DATA" based on the differential full-swing signal. The first edge buffer circuit 140-1 may transmit the restored data "DATA" to the outside through the first pad 130-1.

Below, for convenience of description, an operation of the memory device 100 will be described with reference to an example embodiment in which the memory device 100 receives the data "DATA" from the outside or the memory device 100 transmits the data "DATA" to the outside. However, the inventive concepts are not limited thereto. For example, as in the above description, the memory device 100 may receive various kinds of signals from the outside or may transmit various kinds of signals to the outside.

Figure 3:
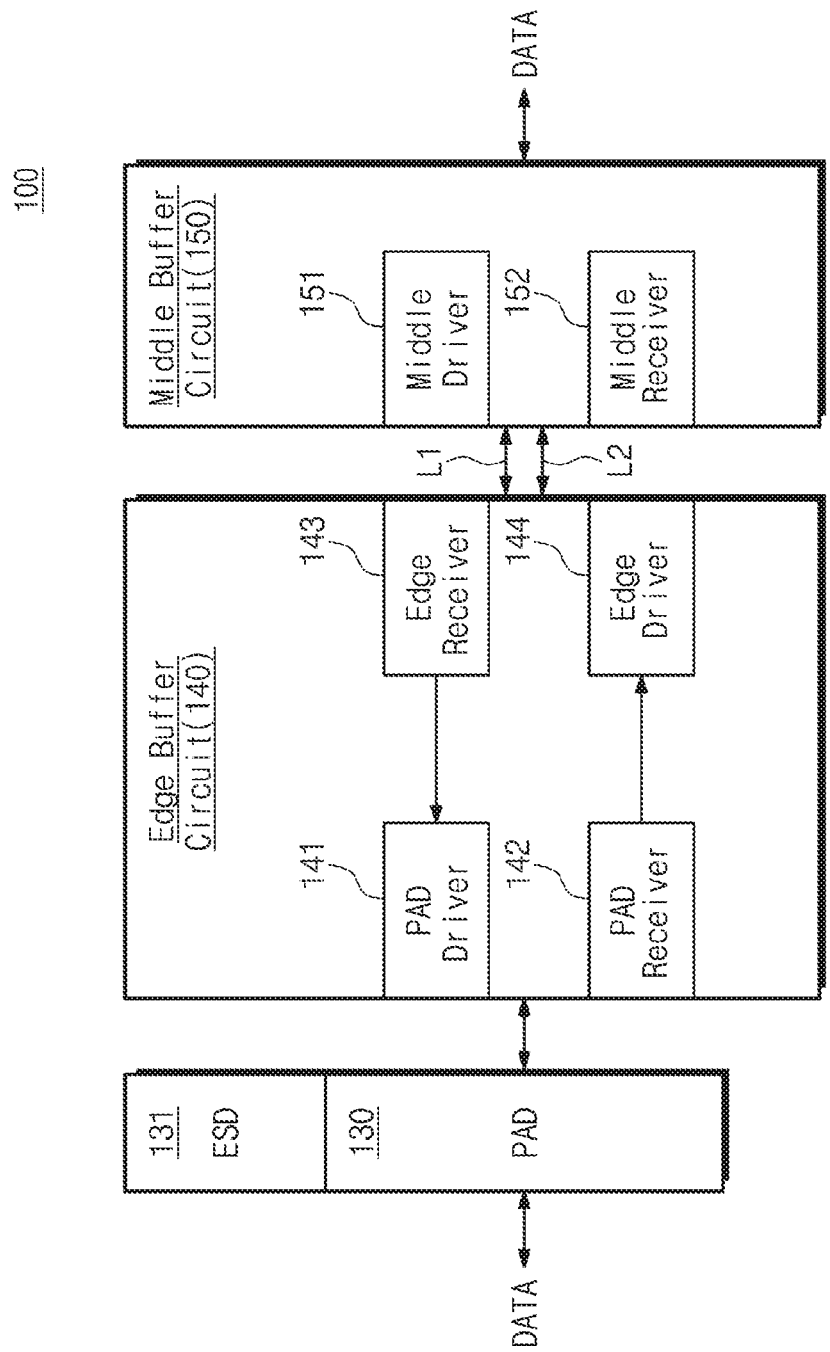
FIG. 3 is a block diagram illustrating circuits associated with a pad of a memory device of FIG. 2.

FIG. 3 is a block diagram illustrating circuits associated with a pad of a memory device of FIG. 2. Referring to FIG. 3, the memory device 100 may include a pad 130, an electro static discharge (ESD) 131, an edge buffer circuit 140, and/or a middle buffer circuit 150. As illustrated in FIG. 2, the pad 130 and the edge buffer circuit 140 may be placed in the first region of the memory device 100, and the middle buffer circuit 150 may be placed in the second region of the memory device 100.

The memory device 100 may be stacked on a board. In some example embodiments, the pad 130 of the memory device 100 may be connected with a pad of a board or a pad of any other memory device through the wire bonding. As such, through the pad 130, the memory device 100 may receive a signal from the board or the other memory device or may transmit a signal to the other memory device.

The ESD 131 may reduce or prevent electrostatic discharge which may be generated upon connecting a pad of the memory device 100 in the wire bonding manner.

The data "DATA" may be received from the outside through the pad 130. The edge buffer circuit 140 may transmit the data "DATA" received from the outside to the middle buffer circuit 150. As such, the data "DATA" received from the outside may be transmitted to circuits in the second region.

The middle buffer circuit 150 may receive the data "DATA" from the memory cell array 110 and may transmit the received data "DATA" to the edge buffer circuit 140. The edge buffer circuit 140 may transmit the transmitted data "DATA" to the outside through the pad 130.

The edge buffer circuit 140 may include a pad driver 141, a pad receiver 142, an edge receiver 143, and/or an edge driver 144.

The pad driver 141 may perform an operation of outputting the data "DATA" to the outside. For example, in a read operation of the memory device 100, the pad driver 141 may output the data "DATA" transmitted from the middle buffer circuit 150 to the outside through the pad 130.

The pad receiver 142 may perform an operation of receiving the data "DATA" from the outside. For example, in a write operation of the memory device 100, the pad receiver 142 may receive the data "DATA" through the pad 130 and may transmit the received data "DATA" to the edge driver 144. The data "DATA" may be transmitted to the middle buffer circuit 150 through the edge driver 144 so as to be stored in the memory cell array 110.

The edge receiver 143 may receive the data "DATA" from the middle buffer circuit 150 and may transmit the received data "DATA" to the pad driver 141. In some example embodiments, the edge receiver 143 may receive the data "DATA" from the middle buffer circuit 150 in the form of a differential small-swing signal. The edge receiver 143 may convert a differential small-swing signal to a differential full-swing signal and may restore the data "DATA" based on the converted signal. The edge receiver 143 may transmit the restored data "DATA" to the pad driver 141.

The edge driver 144 may receive the data "DATA" from the pad receiver 142 and may transmit the received data "DATA" to the middle buffer circuit 150. In some example embodiments, to transmit the data "DATA" to the middle buffer circuit 150, the edge driver 144 may transmit the differential small-swing signal corresponding to the data "DATA" to the middle buffer circuit 150.

The middle buffer circuit 150 may include a middle driver 151 and a middle receiver 152.

The middle driver 151 may transmit the data "DATA" read from the memory cell array 110 to the edge receiver 143. In some example embodiments, to transmit the data "DATA" to the edge buffer circuit 140, the middle driver 151 may transmit the differential small-swing signal corresponding to the data "DATA" to the edge receiver 143.

The middle receiver 152 may receive the data "DATA" from the edge driver 144 and may transmit the received data "DATA" to the logic circuit 160. In some example embodiments, the middle receiver 152 may receive the data "DATA" from the edge driver 144 in the form of a differential small-swing signal. The middle receiver 152 may convert the differential small-swing signal to the differential full-swing signal and may restore the data "DATA" based on the converted signal. The middle receiver 152 may transmit the restored data "DATA" to the logic circuit 160. As such, the data "DATA" transmitted to the logic circuit 160 may be stored in the memory cell array 110.

As illustrated in FIG. 3, the edge receiver 143 and the middle receiver 152 may perform the same operation, and the edge driver 144 and the middle driver 151 may perform the same operation. Accordingly, the edge receiver 143 and the middle receiver 152 may be present in different regions, but may be implemented in similar forms. Also, the edge driver 144 and the middle driver 151 may be present in different regions, but may be implemented in similar forms.

Figure 4:
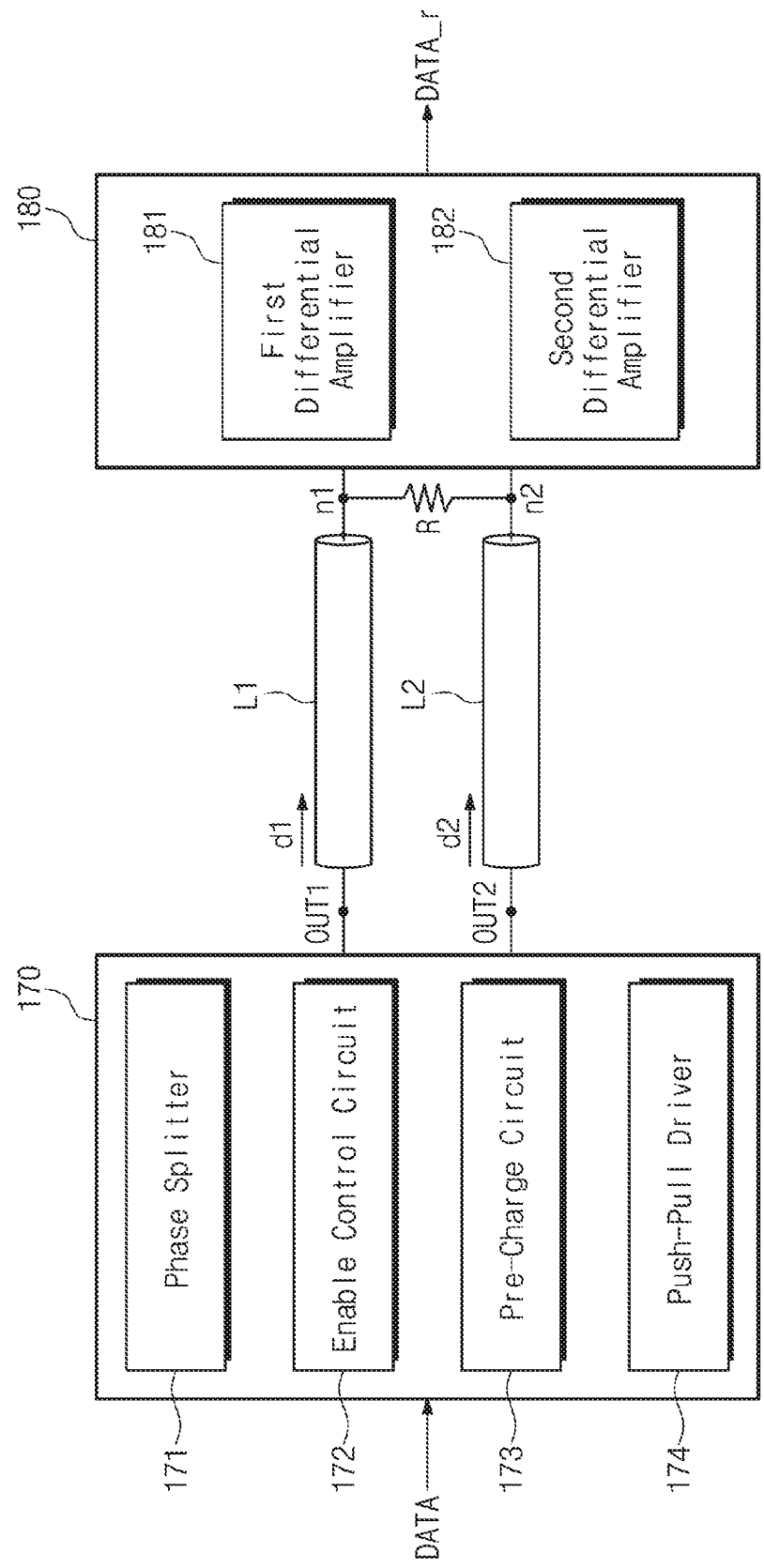
FIG. 4 is a block diagram illustrating a driver and a receiver according to at least one example embodiment.

FIG. 4 is a block diagram illustrating a driver and a receiver according to at least one example embodiment. Referring to FIG. 4, a driver 170 may correspond to the edge driver 144 and the middle driver 151 of FIG. 3, and a receiver 180 may correspond to the edge receiver 143 and the middle receiver 152 of FIG. 3. As such, the edge driver 144, the middle driver 151, the edge receiver 143, and the middle receiver 152 of FIG. 3 will be described through a description of the driver 170 and the receiver 180.

The driver 170 may receive the data "DATA" and may transmit the data "DATA" to the receiver 180 through the first signal line L1 and the second signal line L2. The driver 170 may drive the first signal line L1 and the second signal line L2 such that a differential small-swing signal corresponding to the data "DATA" are transmitted to the receiver 180.

The driver 170 may include a phase splitter 171, an enable control circuit 172, a pre-charge circuit 173, and/or a push-pull driver 174.

The phase splitter 171 may generate a first data signal, a phase of which is identical to that of the received data "DATA", and a second data signal, a phase of which corresponds to an inverted phase of the received data "DATA".

The enable control circuit 172 may generate an enable signal for controlling an operation of the driver 170. For example, the enable control circuit 172 may generate the enable signal based on the received data "DATA" and a delay signal obtained by delaying the received data "DATA" by a given time. The enable control circuit 172 may generate the enable signal such that the enable signal is set to logical high during a high period of the received data "DATA" or the delay signal.

In some example embodiments, the driver 170 may operate when the enable signal is set to logical high; an operation of the driver 170 may be stopped when the enable signal is set to logical low.

The pre-charge circuit 173 may pre-charge a voltage of a first output node OUT1 of the driver 170 connected with one end of the first signal line L1 and a voltage of a second output node OUT2 of the driver 170 connected with one end of the second signal line L2, with a voltage of a given magnitude. The first output node OUT1 and the second output node OUT2 may be pre-charged by the pre-charge circuit 173 to have a voltage of the same magnitude. For example, in the case where the enable signal is set to logical low, the pre-charge circuit 173 may pre-charge the first output node OUT1 and the second output node OUT2 to allow the first output node OUT1 and the second output node OUT2 to have a voltage of the same magnitude. In this case, a current may not flow through the first signal line L1 and the second signal line L2.

The push-pull driver 174 may adjust the magnitude of the voltage of the first output node OUT1 and the magnitude of the voltage of the second output node OUT2, based on the first data signal and the second data signal generated by the phase splitter 171. The push-pull driver 174 may transmit a differential small-swing signal corresponding to the data "DATA" to the receiver 180 by differently setting the magnitude of the voltage of the first output node OUT1 and the magnitude of the voltage of the second output node OUT2.

For example, in the case where the enable signal is set to logical high, the push-pull driver 174 may operate. In the case where the first data signal has a high value and the second data signal has a low value, the push-pull driver 174 may allow the magnitude of the voltage of the first output node OUT1 to be greater than the magnitude of the voltage of the second output node OUT2. Since the voltage of the first output node OUT1 is greater than the voltage of the second output node OUT2, a current may be output from the first output node OUT1 in a first direction d1. The current output in the first direction d1 may be transmitted to the second output node OUT2 after sequentially passing through the first signal line L1, a resistor "R", and the second signal line L2.

In the case where the first data signal has the low value and the second data signal has the high value, the push-pull driver 174 may allow the magnitude of the voltage of the second output node OUT2 to be greater than the magnitude of the voltage of the first output node OUT1. Since the voltage of the second output node OUT2 is greater than the voltage of the first output node OUT1, a current may be output from the second output node OUT2 in a second direction d2. The current output in the second direction d2 may be transmitted to the first output node OUT1 after sequentially passing through the second signal line L2, the resistor "R", and the first signal line L1.

As described above, the driver 170 may make a direction of a current flowing through the first signal line L1 and the second signal line L2 different based on the received data "DATA". In the case where a current flows between a first node n1 connected with an opposite end of the first signal line L1 and a second node n2 connected with an opposite end of the second signal line L2, voltages of the first node n1 and the second node n2 may be different. For example, in the case where a current flows in the first direction d1, the magnitude of the voltage of the first node n1 may be greater than the magnitude of the voltage of the second node n2; in the case where a current flows in the second direction d2, the magnitude of the voltage of the second node n2 may be greater than the magnitude of the voltage of the first node n1. That is, the driver 170 may drive the first signal line L1 and the second signal line L2 based on the data "DATA" to allow the magnitude of the voltage of the first node n1 to be different from the magnitude of the voltage of the second node n2. The receiver 180 may restore the data "DATA" based on a voltage difference of the first node n1 and the second node n2.

Currents transmitted through the first signal line L1 and the second signal line L2 may be converted to a voltage through the resistor "R" between the first node n1 and the second node n2.

For example, in the case where the data "DATA" are set to logical high, the voltage of the first node n1 may be greater than the voltage of the second node n2. In the case where the data "DATA" are set to logical low, the voltage of the second node n2 may be greater than the voltage of the first node n1. As such, the voltages of the first and second nodes n1 and n2 may vary with the data "DATA", and a signal corresponding to the data "DATA" may be transmitted in the form of a differential signal through the voltages of the first and second nodes n1 and n2.

The first signal line L1 and the second signal line L2 may be placed above the memory cell array 110 and may be formed lengthwise. Accordingly, compared with the resistor "R", the first signal line L1 and the second signal line L2 may act as a relatively large load in terms of resistance and capacitance thereof. Accordingly, a voltage difference of the first node n1 and the second node n2 may be small. As such, a signal transmitted through the first node n1 and the second node n2 may be a differential small-swing signal.

The receiver 180 may receive a signal corresponding to the data "DATA" from the driver 170 through the first signal line L1 and the second signal line L2. The signal transmitted through the first node n1 and the second node n2 may be a differential small-swing signal. The receiver 180 may convert the differential small-swing signal to the differential full-swing signal, and may restore the data "DATA" based on the differential full-swing signal. The receiver 180 may transmit the restored data DATA_r to the logic circuit 160.

The receiver 180 may include a first differential amplifier 181 and a second differential amplifier 182. The first differential amplifier 181 may amplify the differential small-swing signal to the differential full-swing signal by using, for example, an NMOS transistor(s). The second differential amplifier 182 may amplify the differential small-swing signal to the differential full-swing signal by using, for example, a PMOS transistor(s). An output node of the first differential amplifier 181 may be connected with an output node of the second differential amplifier 182. A rising time and a falling time of the differential full-swing signal which may be obtained through the output nodes may be adjusted by connecting the output nodes of the first differential amplifier 181 and the second differential amplifier 182. As such, a duty of the differential full-swing signal may be compensated.

Figure 5:
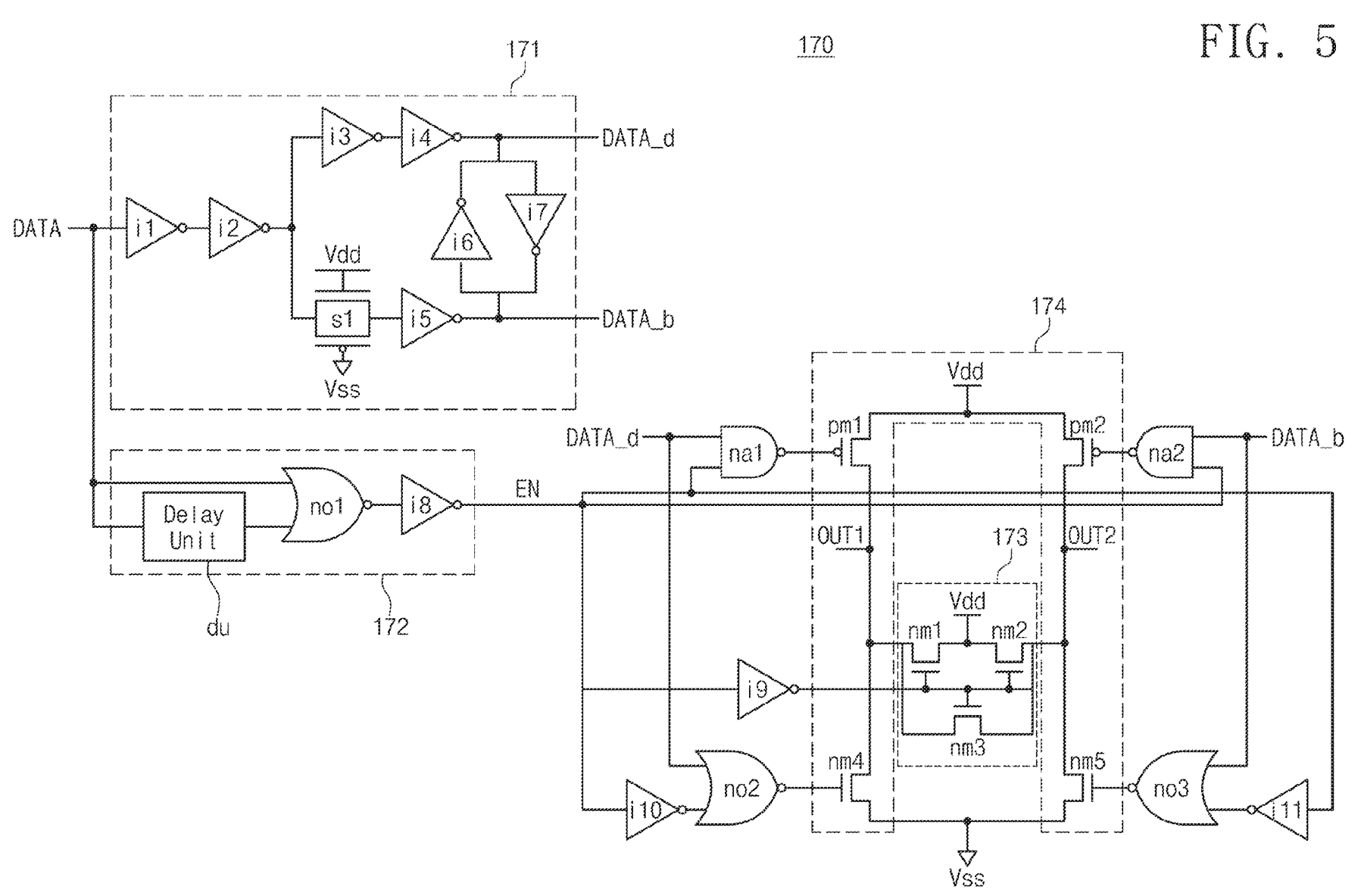

FIG. 5 is a diagram illustrating an example circuit of a driver of FIG. 4. Referring to FIGS. 4 and 5, the driver 170 may include the phase splitter 171, the enable control circuit 172, the pre-charge circuit 173, and the push-pull driver 174.

The phase splitter 171 may receive the data "DATA", and may generate a first data signal DATA_d, a phase of which is identical to that of the data "DATA", and a second data signal DATA_b, a phase of which corresponds to an inverted phase of the data "DATA". For example, in the case where the first data signal DATA_d is set to logical high, the second data signal DATA_b may be set to logical low; in the case where the first data signal DATA_d is set to logical low, the second data signal DATA_b may be set to logical high;

As illustrated in FIG. 5, the phase splitter 171 may include first to seventh inverters i1 to i7, and a first switch s1. The first switch s1 may be implemented with a transmission gate in which, for example, PMOS and NMOS transistors are connected in parallel. The first switch s1 may delay the input signal by the same magnitude as the third inverter i3.

An output terminal of the first inverter i1 may be connected with an input terminal of the second inverter i2, and an output terminal of the second inverter i2 may be connected with input terminals of the third inverter i3 and the first switch s1. An output terminal of the third inverter i3 may be connected with an input terminal of the fourth inverter i4, and an output terminal of the fourth inverter i4 may be connected with an output terminal of the sixth inverter i6 and an input terminal of the seventh inverter i7. An output terminal of the first switch s1 may be connected with an input terminal of the fifth inverter i5, and an output terminal of the fifth inverter i5 may be connected with an input terminal of the sixth inverter i6 and an output terminal of the seventh inverter i7. The data "DATA" may be provided to the input terminal of the first inverter i1. The first data signal DATA_d may be output from the output terminal of the fourth inverter i4, and the second data signal DATA_b may be output from the output terminal of the fifth inverter i5.

The enable control circuit 172 may receive the data "DATA" and may generate an enable signal EN based on the data "DATA". The enable control circuit 172 may include a delay unit du, a first NOR gate no1, and an eighth inverter i8. An output terminal of the delay unit du may be connected with an input terminal of the first NOR gate no1, and an output terminal of the first NOR gate no1 may be connected with an input terminal of the eighth inverter i8.

The data "DATA" may be provided to the input terminal of the first NOR gate no1 and an input terminal of the delay unit du. The delay unit du may delay the provided data "DATA" by a given time and may output the delayed data. The data "DATA" and the delayed data may be provided to the first NOR gate no1, and a signal output from the first NOR gate no1 may be provided to the eighth inverter i8. The enable signal EN may be a signal output from the eighth inverter i8. The generated enable signal EN may have a high value while the data "DATA" and the delayed data have a high value.

The pre-charge circuit 173 may pre-charge the first output node OUT1 and the second output node OUT2 such that the voltage of the first output node OUT1 and the voltage of the second output node OUT2 are identical to each other. The pre-charge circuit 173 may receive the enable signal EN inverted by the ninth inverter i9 as a control signal. The pre-charge circuit 173 may include first to third NMOS transistors nm1 to nm3. Gate terminals of the first to third NMOS transistors nm1 to nm3 may be connected to each other, and the enable signal EN inverted by the ninth inverter i9 may be input a common gate terminal of the first to third NMOS transistors nm1 to nm3. The first NMOS transistor nm1 and the second NMOS transistor nm2 may be connected in series, and a first terminal of the first NMOS transistor nm1 and a first terminal of the second NMOS transistor nm2 may be connected to each other. A first terminal of the third NMOS transistor nm3 may be connected with a second terminal of the first NMOS transistor nm1, and a second terminal of the third NMOS transistor nm3 may be connected with a second terminal of the second NMOS transistor nm2.

In the case where the enable signal EN is set to logical low, the first to third NMOS transistors nm1 to nm3 may be turned on, and the first output node OUT1 and the second output node OUT2 may be pre-charged to a first power supply voltage Vdd. In this case, the voltages of the first output node OUT1 and the second output node OUT2 may be identically maintained.

The push-pull driver 174 may adjust the voltages of the first output node OUT1 and the second output node OUT2, based on the first data signal DATA_d and the second data signal DATA_b.

The push-pull driver 174 may include first and second PMOS transistors pm1 and pm2, and fourth and fifth NMOS transistors nm4 and nm5. A source terminal of the first PMOS transistor pm1 may be connected with a source terminal of the second PMOS transistor pm2, and the first power supply voltage Vdd may be provided to a common source terminal of the first PMOS transistor pm1 and the second PMOS transistor pm2. A drain terminal of the first PMOS transistor pm1 may be connected with a drain terminal of the fourth NMOS transistor nm4, and a drain terminal of the second PMOS transistor pm2 may be connected with a drain terminal of the fifth NMOS transistor nm5. A source terminal of the fourth NMOS transistor nm4 may be connected with a source terminal of the fifth NMOS transistor nm5, and a second power supply voltage Vss may be provided to a common source terminal of the fourth NMOS transistor nm4 and the fifth NMOS transistor nm5. The first power supply voltage Vdd may be a positive power supply voltage, and the second power supply voltage Vss may be a ground voltage.

A first NAND gate na1 may receive the first data signal DATA_d and the enable signal EN and may output a corresponding signal depending on the first data signal DATA_d and the enable signal EN. A signal from the first NAND gate na1 may be input to a gate terminal of the first PMOS transistor pm1.

A second NAND gate na2 may receive the second data signal DATA_b and the enable signal EN and may output a corresponding signal depending on the second data signal DATA_b and the enable signal EN. A signal from the second NAND gate na2 may be input to a gate terminal of the second PMOS transistor pm2.

A second NOR gate no2 may receive the first data signal DATA_d and an inverted version of the enable signal EN provided through a tenth inverter I10 and may output a corresponding signal depending on the first data signal DATA_d and the inverted enable signal. A signal which is output from the second NOR gate no2 may be input to a gate terminal of the fourth NMOS transistor nm4.

A third NOR gate no3 may receive the second data signal DATA_d and an inverted version of the enable signal EN provided through an eleventh inverter i11 and may output a corresponding signal depending on the second data signal DATA_b and the inverted enable signal. A signal which is output from the third NOR gate no3 may be input to a gate terminal of the fifth NMOS transistor nm5.

As such, the push-pull driver 174 may perform an operation depending on the enable signal EN. For example, in the case where the enable signal EN is set to logical high, at least one of the first and second PMOS transistors pm1 and pm2 and the fourth and fifth NMOS transistors nm4 and nm5 may be turned on.

In the case wherein the push-pull driver 174 operates, the voltages of the first output node OUT1 and the second output node OUT2 may be different. A detailed operation of the push-pull driver 174 will be in detail described with reference to FIGS. 6 and 7.

Figure 6:
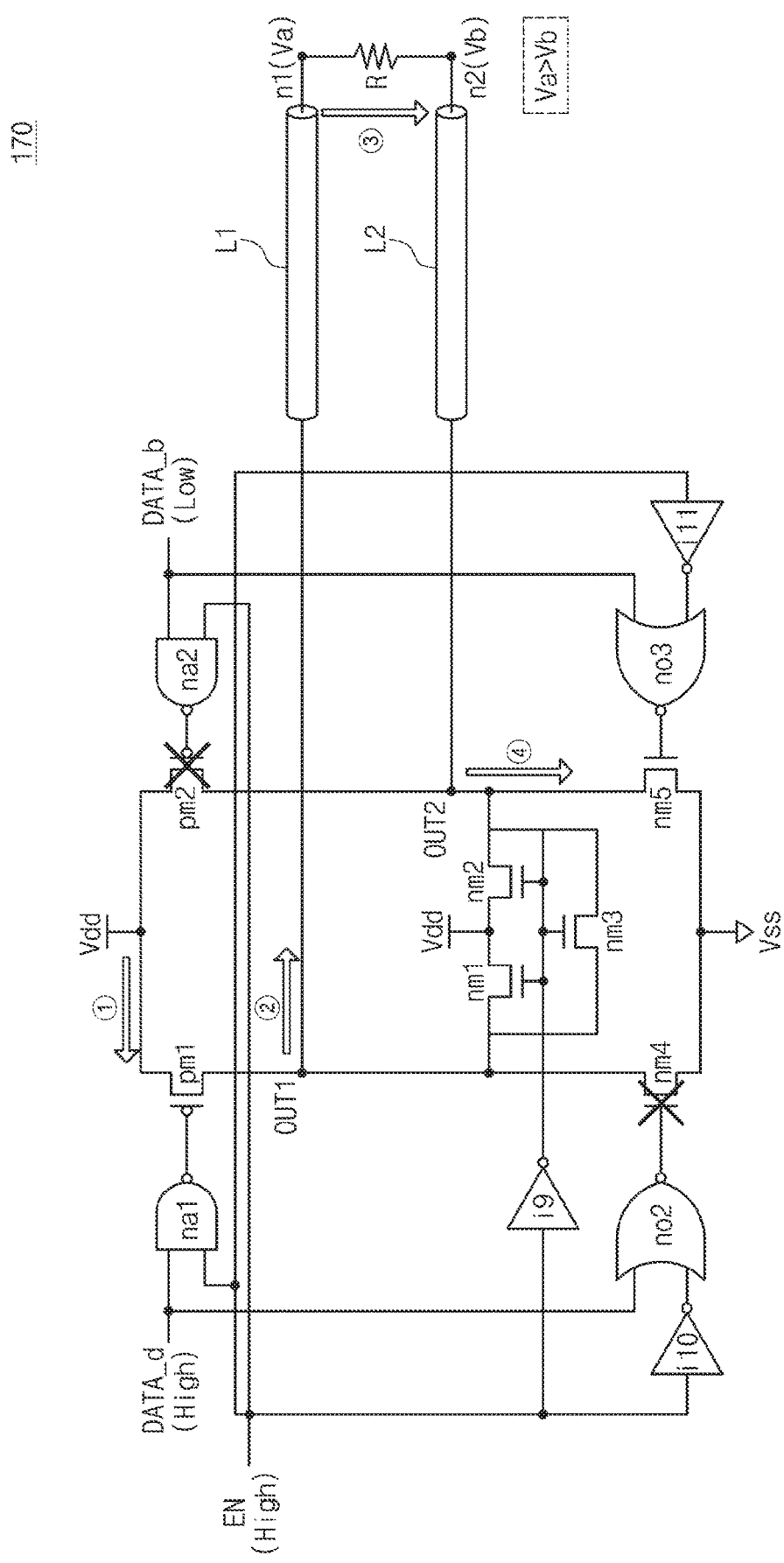
FIG. 6 is a circuit diagram illustrating an operation of a driver of FIG. 5 when an enable signal and data are set to logical high.

FIG. 6 is a circuit diagram illustrating an operation of a driver of FIG. 5 when an enable signal and data are set to logical high. Referring to FIGS. 5 and 6, the first output node OUT1 may be connected with the first signal line L1, and the second output node OUT2 may be connected with the second signal line L2.

In the case where the data "DATA" are set to logical high, the first data signal DATA_d may be set to logical high, and the second data signal DATA_b may be set to logical low. In this case, the first PMOS transistor pm1 and the fifth NMOS transistor nm5 may be turned on, and the second PMOS transistor pm2 and the fourth NMOS transistor nm4 may be turned off. In the case where the first PMOS transistor pm1 and the fifth NMOS transistor nm5 are turned on, a current may flow from the first power supply voltage Vdd to the fifth NMOS transistor nm5 through the first PMOS transistor pm1, the first signal line L1, and the second signal line L2, following the path of arrows 1 through 4. In this case, since a current flows from the first node n1 to the second node n2, a first node voltage Va may be greater than a second node voltage Vb.

That is, in the case where the data "DATA" are set to logical high, the first node voltage Va may be greater than the second node voltage Vb. The driver 170 may drive the first signal line L1 and the second signal line L2 based on the data "DATA" such that the first node voltage Va is greater than the second node voltage Vb, and may transmit a differential signal corresponding to the first node voltage Va and the second node voltage Vb to the receiver 180.

Figure 7:
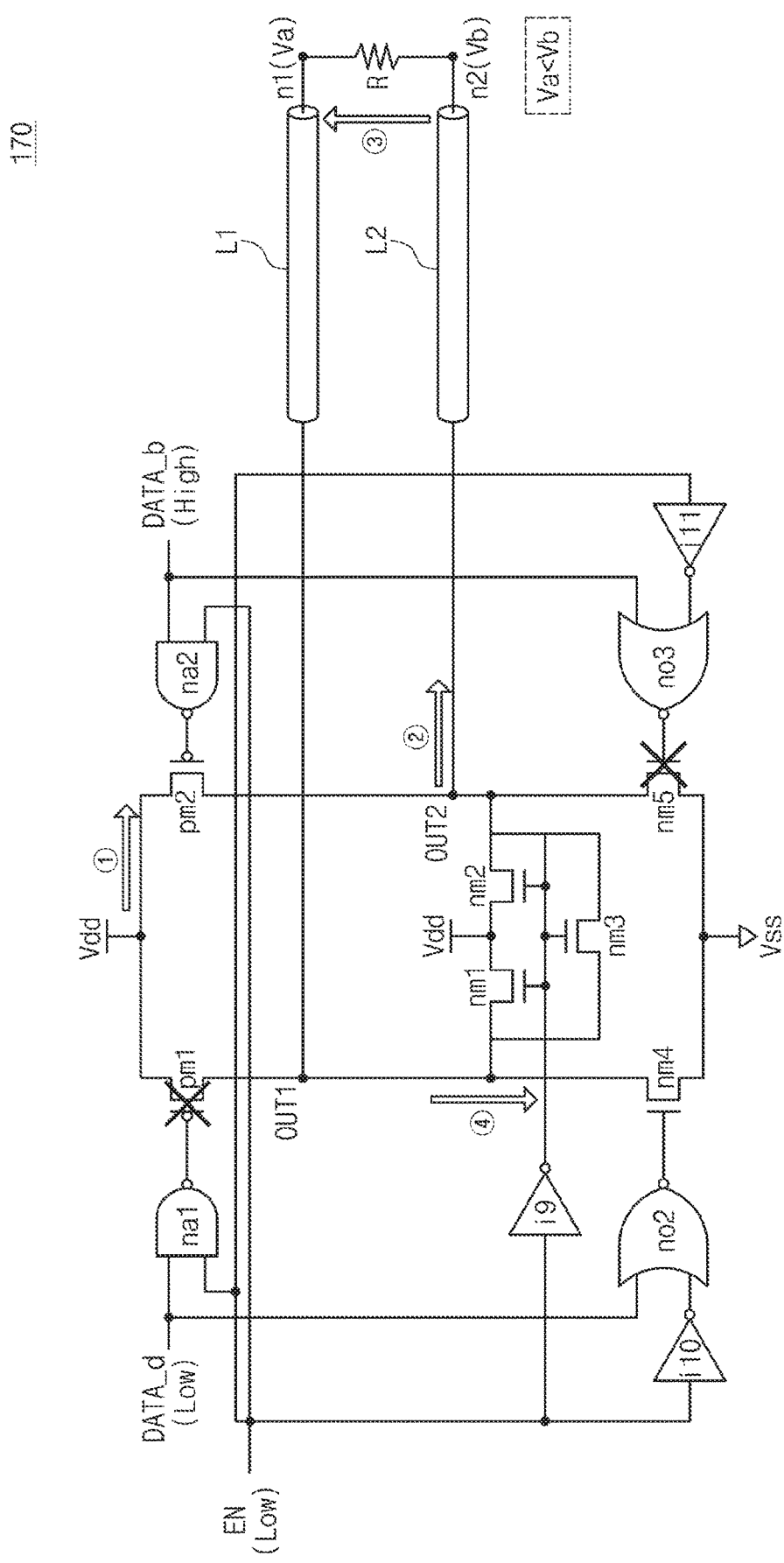
FIG. 7 is a circuit diagram illustrating an operation of a driver of FIG. 5 when an enable signal is set to logical high and data are set to logical low.

FIG. 7 is a circuit diagram illustrating an operation of a driver of FIG. 5 when an enable signal is set to logical high and data are set to logical low. Referring to FIGS. 5 and 7, the first output node OUT1 may be connected with the first signal line L1, and the second output node OUT2 may be connected with the second signal line L2.

In the case where the data "DATA" are set to logical low, the first data signal DATA_d may be set to logical low, and the second data signal DATA_b may be set to logical high. In this case, the first PMOS transistor pm1 and the fifth NMOS transistor nm5 may be turned off, and the second PMOS transistor pm2 and the fourth NMOS transistor nm4 may be turned on. In the case where the second PMOS transistor pm2 and the fourth NMOS transistor nm4 are turned on, a current may flow from the first power supply voltage Vdd to the fourth NMOS transistor nm4 through the second PMOS transistor pm2, the second signal line L2, and the first signal line L1, following the path of arrows 1 through 4. In this case, since a current flows from the second node n2 to the first node n1, the second node voltage Vb may be greater than the first node voltage Va.

That is, in the case where the data "DATA" are set to logical low, the first node voltage Va may be smaller than the second node voltage Vb. The driver 170 may drive the first signal line L1 and the second signal line L2 based on the data "DATA" such that the first node voltage Va is smaller than the second node voltage Vb, and may transmit a differential signal corresponding to the first node voltage Va and the second node voltage Vb to the receiver 180.

Figure 8:
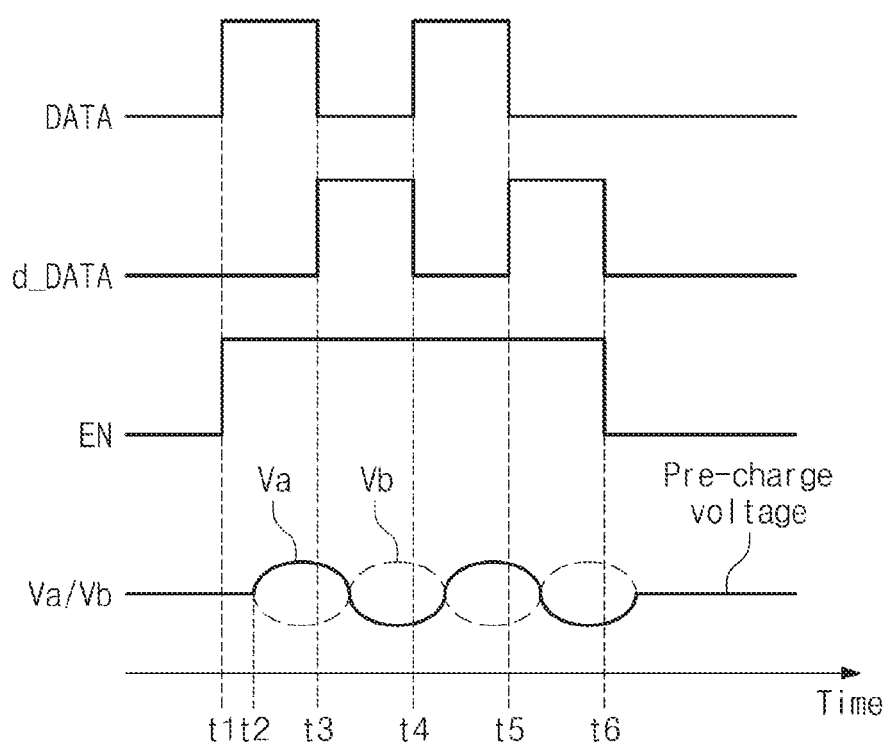
FIG. 8 is a timing diagram illustrating an example of a signal generated according to an operation of a driver of FIG. 5.

FIG. 8 is a timing diagram illustrating an example embodiment of a signal generated according to an operation of a driver of FIG. 5. Referring to FIGS. 5 to 8, the driver 170 may receive the data "DATA" of FIG. 8. The data "DATA" may include a rising edge at a first time t1 and a fourth time t4 and a falling edge at a third time t3 and a fifth time t5. The delay unit du of the enable control circuit 172 may delay the data "DATA" to output the delayed data d_DATA. For example, the delay unit du may delay the data "DATA" by a pulse width of the data "DATA" (e.g., by a difference between the third time t3 and the first time t1). The delayed data d_DATA may include a rising edge at the third time t3 and the fourth time t5 and a falling edge at the fourth time t4 and a sixth time t6.

The enable control circuit 172 may generate the enable signal EN based on the data "DATA" and the delayed data d_DATA. The enable signal EN may maintain a high value from the first time t1 when a first rising edge of the data "DATA" is generated to the sixth time t6 when the last falling edge of the delayed data d_DATA is generated. As such, the driver 170 may operate from the first time t1 to the sixth time t6. The driver 170 may drive the first signal line L1 and the second signal line L2 such that a differential small-swing signal corresponding to the data "DATA" are transmitted to the receiver 180 from the first time t1 to the sixth time t6.

In the case where the driver 170 operates based on the data "DATA", the delayed data d_DATA, and the enable signal EN, the first node voltage Va and the second node voltage Vb may change. As illustrated in FIG. 8, the first node voltage Va and the second node voltage Vb may maintain a pre-charge voltage until a second time t2 and may change from the second time t2 due to a delay of the first signal line L1 and the second signal line L2. In the case where the data "DATA" are set to logical high, the first node voltage Va may increase, and the second node voltage Vb may decrease. In the case where the data "DATA" are set to logical low, the first node voltage Va may decrease, and the second node voltage Vb may increase. Since the first signal line L1 and the second signal line L2 act as a large load, a difference between the first node voltage Va and the second node voltage Vb may be small. However, since the data "DATA" are transmitted in the form of a differential signal, the receiver 180 may restore the data "DATA" through the first node voltage Va and the second node voltage Vb.

The circuits and signals illustrated in FIGS. 5 to 8 are only one example embodiment for describing an operation of the driver 170, and the driver 170 of the inventive concepts are not limited thereto. The driver 170 of the inventive concepts may be implemented with various forms of circuits within a range where the circuits perform the same function or similar functions.

Figure 9:
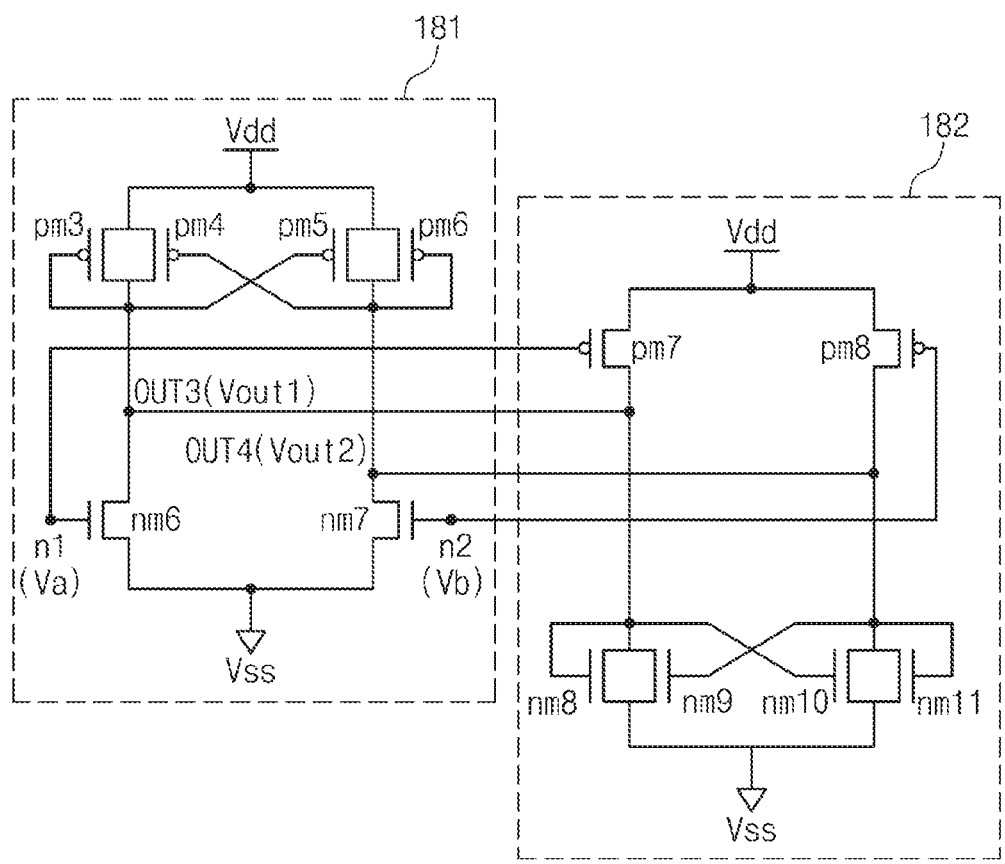
FIG. 9 is a diagram illustrating an example circuit of a receiver of FIG. 4.

FIG. 9 is a diagram illustrating an example circuit of a receiver of FIG. 4. Referring to FIG. 8, the receiver 180 may include the first differential amplifier 181 and the second differential amplifier 182.

The first differential amplifier 181 may include third to sixth PMOS transistors pm3 to pm6, a sixth NMOS transistor nm6, and a seventh NMOS transistor nm7. The third PMOS transistor pm3 and the fourth PMOS pm4 may be connected in parallel, and the fifth PMOS transistor pm5 and the sixth PMOS transistor pm6 may be connected in parallel. A gate terminal of the third PMOS transistor pm3 may be connected with a gate terminal of the fifth PMOS transistor pm5, and a gate terminal of the fourth PMOS transistor pm4 may be connected with a gate terminal of the sixth PMOS transistor pm6. A common drain terminal of the third and fourth PMOS transistors pm3 and pm4 may be connected with a common gate terminal of the third and fifth PMOS transistors pm3 and pm5, and a common drain terminal of the fifth and sixth PMOS transistors pm5 and pm6 may be connected with a common gate terminal of the fourth and sixth PMOS transistors pm4 and pm6. That is, the third to sixth PMOS transistors pm3 to pm6 which are cross coupled may act as a load.

The common drain terminal of the third and fourth PMOS transistors pm3 and pm4 may be connected with a drain terminal of the sixth NMOS transistor nm6. The common drain terminal of the fifth and sixth PMOS transistors pm5 and pm6 may be connected with a drain terminal of the seventh NMOS transistor nm7. The first power supply voltage Vdd may be provided to a common source terminal of the third and fourth PMOS transistors pm3 and pm4 and a common source terminal of the fifth and sixth PMOS transistors pm5 and pm6. The second power supply voltage Vss may be provided to a source terminal of the sixth NMOS transistor nm6 and a source terminal of the seventh NMOS transistor nm7. The first power supply voltage Vdd may be a positive power supply voltage, and the second power supply voltage Vss may be a ground voltage.

A first node n1 may be connected with a gate terminal of the sixth NMOS transistor nm6, and a second node n2 may be connected with a gate terminal of the seventh NMOS transistor nm7. As such, the first node voltage Va may be input to the gate terminal of the sixth NMOS transistor nm6, and the second node voltage Vb may be input to the gate terminal of the seventh NMOS transistor nm7. A third output node OUT3 may be connected with a drain terminal of the sixth NMOS transistor nm6, and a fourth output node OUT4 may be connected with a drain terminal of the seventh NMOS transistor nm7.

A first output voltage Vout1 of the third output node OUT3 and a second output voltage Vout2 of the fourth output node OUT4 may vary with the first node voltage Va and the second node voltage Vb. The first output voltage Vout1 and the second output voltage Vout2 may be voltages obtained by amplifying the first node voltage Va and the second node voltage Vb.

For example, in the case where the first node voltage Va increases and the second node voltage Vb decreases, the first output voltage Vout1 may decrease, and the second output voltage Vout2 may increase. In the case where the first node voltage Va decreases and the second node voltage Vb increases, the first output voltage Vout1 may increase, and the second output voltage Vout2 may decrease. That is, as the first node voltage Va and the second node voltage Vb swing, the first output voltage Vout1 and the second output voltage Vout2 may swing. Due to the first power supply voltage Vdd and the second power supply voltage Vss, a swing width of the first output voltage Vout1 and the second output voltage Vout2 may be greater than a swing width of the first node voltage Va and the second node voltage Vb.

The second differential amplifier 182 may include eighth to eleventh NMOS transistors nm8 to nm11, a seventh PMOS transistor pm7, and an eighth PMOS transistor pm8. The eighth NMOS transistor nm8 and the ninth NMOS nm9 may be connected in parallel, and the tenth NMOS transistor nm10 and the eleventh NMOS transistor nm11 may be connected in parallel. Like the third to sixth PMOS transistors pm3 to pm6 of the first differential amplifier 181, the eighth to eleventh NMOS transistors nm8 to nm11 which are cross coupled may act as a load of the second differential amplifier 182.

A common drain terminal of the eighth and ninth NMOS transistors nm8 and nm9 may be connected with a drain terminal of the seventh PMOS transistor pm7. A common drain terminal of the tenth and eleventh NMOS transistors nm10 and nm11 may be connected with a drain terminal of the eighth PMOS transistor pm8. The first power supply voltage Vdd may be provided to a common source terminal of the seventh and eighth PMOS transistors pm7 and pm8. The second power supply voltage Vss may be provided to a common source terminal of the eighth and ninth NMOS transistors nm8 and nm9 and a common source terminal of the tenth and eleventh NMOS transistors nm10 and nm11.

The first node n1 may be connected with a gate terminal of the seventh PMOS transistor pm7, and the second node n2 may be connected with a gate terminal of the eighth PMOS transistor pm8. As such, the first node voltage Va may be input to the gate terminal of the seventh PMOS transistor pm7, and the second node voltage Vb may be input to the gate terminal of the eighth PMOS transistor pm8. The third output node OUT3 may be connected with a drain terminal of the seventh PMOS transistor pm7, and the fourth output node OUT4 may be connected with a drain terminal of the eighth PMOS transistor pm8. That is, the gate terminal of the seventh PMOS transistor pm7 may be connected with the gate terminal of the sixth NMOS transistor nm6 of the first differential amplifier 181, and the gate terminal of the eighth PMOS transistor pm8 may be connected with the gate terminal of the seventh NMOS transistor nm7 of the first differential amplifier 181. Also, the drain terminal of the seventh PMOS transistor pm7 may be connected with the drain terminal of the sixth NMOS transistor nm6 of the first differential amplifier 181, and the drain terminal of the eighth PMOS transistor pm8 may be connected with the drain terminal of the seventh NMOS transistor nm7 of the first differential amplifier 181.

Like the first differential amplifier 181, due to the second differential amplifier 182, the first output voltage Vout1 of the third output node OUT3 and the second output voltage Vout2 of the fourth output node OUT4 may vary with the first node voltage Va and the second node voltage Vb.

For example, in the case where the first node voltage Va increases and the second node voltage Vb decreases, the first output voltage Vout1 may decrease, and the second output voltage Vout2 may increase. In the case where the first node voltage Va decreases and the second node voltage Vb increases, the first output voltage Vout1 may increase, and the second output voltage Vout2 may decrease. That is, as the first node voltage Va and the second node voltage Vb swing, the first output voltage Vout1 and the second output voltage Vout2 may swing. Due to the first power supply voltage Vdd and the second power supply voltage Vss, a swing width of the first output voltage Vout1 and the second output voltage Vout2 may be greater than a swing width of the first node voltage Va and the second node voltage Vb.

As illustrated in FIG. 9, the third output node OUT3 and the fourth output node OUT4 of the first and second differential amplifiers 181 and 182 may be identical. The first differential amplifier 181 may be configured to decrease any one of the third and fourth output nodes OUT3 and OUT4 to the ground voltage Vss in response to the differential small-swing signals (e.g., the first node voltage Va and the second node voltage Vb). The second differential amplifier 182 may be configured to increase the other of the third and fourth output nodes OUT3 and OUT4 to the power supply voltage Vdd in response to the differential small-swing signals (e.g., the first node voltage Va and the second node voltage Vb).

The duty of the first output voltage Vout1 and the second output voltage Vout2 may be compensated by the loads included in the first and second differential amplifiers 181 and 182. Also, a delay time during which a small-swing signal is converted to a full-swing signal may decrease as the first differential amplifier 181 and the second differential amplifier 182 simultaneously amplify the first node voltage Va and the second node voltage Vb such that a small-swing signal is converted to a full-swing signal.

As described above, the receiver 180 may include the first differential amplifier 181 and the second differential amplifier 182, the types of which are different for duty compensation. The receiver 180 may further include at least one inverter (not illustrated). At least one of the first output voltage Vout1 and the second output voltage Vout2 may be restored to the data "DATA" by the inverter. Accordingly, the data "DATA" input to the driver 170 of FIG. 5 may be transmitted to the receiver 180 as a corresponding differential small-swing signal, and the receiver 180 may convert the differential small-swing signal to the differential full-swing signal to restore the data "DATA".

Figure 10:
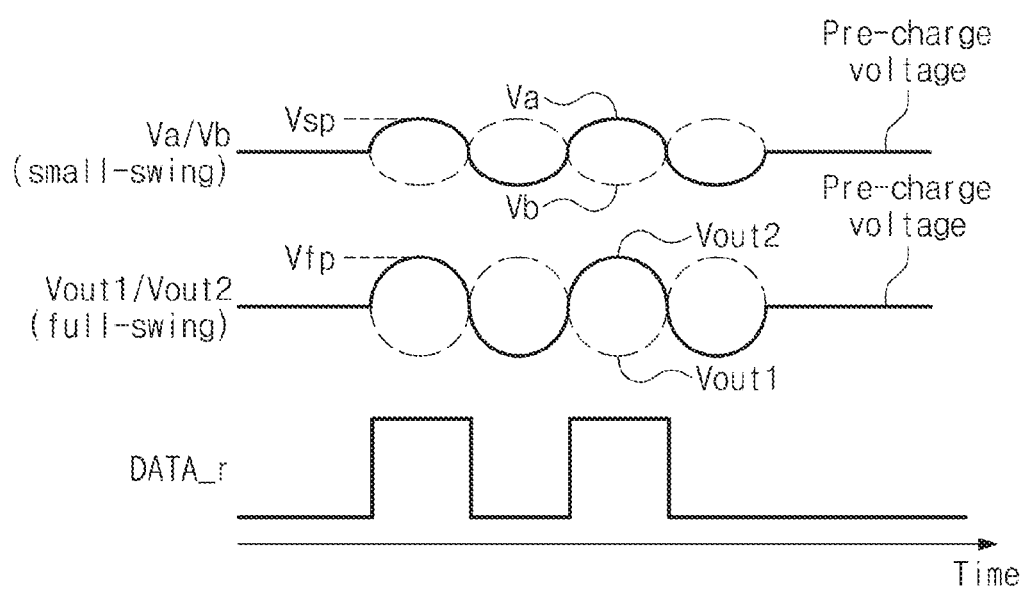
FIG. 10 is a timing diagram illustrating an example of a signal generated according to an operation of a receiver of FIG. 9.

FIG. 10 is a timing diagram illustrating an example embodiment of a signal generated according to an operation of a receiver of FIG. 9. Referring to FIGS. 9 and 10, the receiver 180 may convert the first node voltage Va and the second node voltage Vb to the first output voltage Vout1 and the second output voltage Vout2. The first output voltage Vout1 may rise and fall as the first node voltage Va rises and falls, and the second output voltage Vout2 may rise and fall as the second node voltage Vb rises and falls. The magnitude Vsp of the maximum voltage of the first node voltage Va and the second node voltage Vb may be smaller than the magnitude Vfp of the maximum voltage of the first output voltage Vout1 and the second output voltage Vout2. Accordingly, the first node voltage Va and the second node voltage Vb may correspond to a small-swing signal, and the first output voltage Vout1 and the second output voltage Vout2 may correspond to a full-swing signal.

At least one of the first output voltage Vout1 and the second output voltage Vout2 may be output as the restored data DATA_r in the case of passing through the inverter. The restored data DATA_r of FIG. 10 may correspond to the data "DATA" of FIG. 8.

The circuits and signals illustrated in FIGS. 9 and 10 are only one example embodiment for describing an operation of the receiver 180, and the receiver 180 of the inventive concepts are not limited thereto. The receiver 180 of the inventive concepts may be implemented with various forms of circuits within a range where the circuits perform the same function or similar functions.

Figure 11:
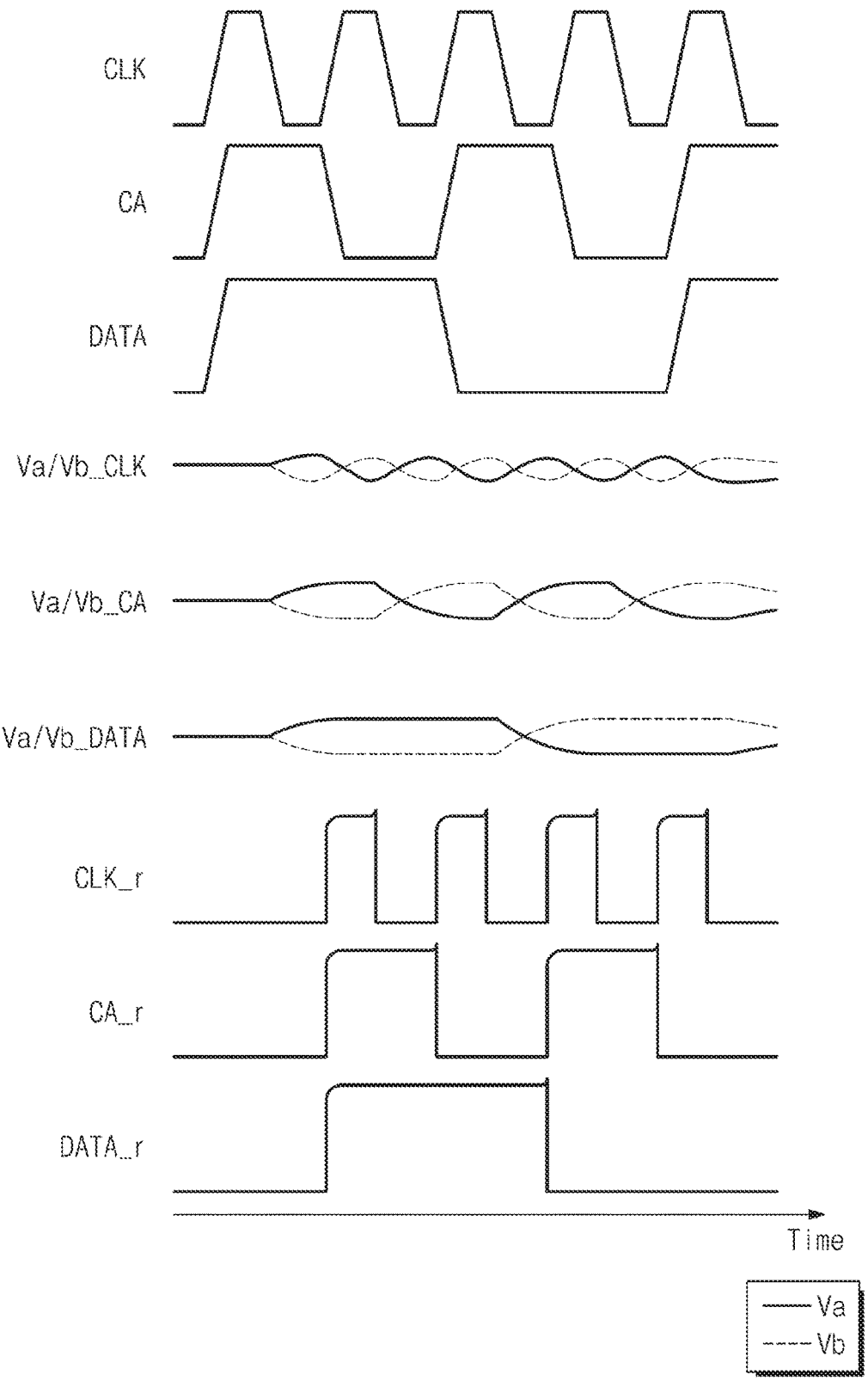
FIG. 11 is a diagram illustrating a result of simulating an operation of a memory device of the inventive concepts depending on various kinds of signals.

FIG. 11 is a diagram illustrating a result of simulating an operation of a memory device of the inventive concepts depending on various kinds of signals. Referring to FIG. 11, the memory device 100 may receive the clock CLK, a command/address signal CA, and the data "DATA". The memory device 100 may receive signals through different pads as illustrated in FIG. 2.

The clock CLK, the command/address signal CA, and the data "DATA" may be signals of different frequencies. For example, the clock CLK may be input at a speed of 3200 Mbps, the command/address signal CA may be input at a speed of 1600 Mbps, and the data "DATA" may be input at a speed of 800 Mbps. As such, FIG. 11 shows an operation simulation result of the memory device 100 when high-frequency signals are input.

The driver 170 of the memory device 100 may transmit a differential small-swing signal (e.g., the first node voltage Va and the second node voltage Vb) corresponding to each of the received clock CLK, the received command/address signal CA, and the received data "DATA" to the receiver 180. The receiver 180 may receive first and second node voltages Va/Vb_CLK corresponding to the clock CLK, first and second node voltages Va/Vb_CA corresponding to the command/address signal CA, and first and second node voltages Va/Vb_DATA corresponding to the data "DATA".

As illustrated in FIG. 11, the first and second node voltages Va/Vb_CLK corresponding to the clock CLK may repeatedly rise and fall depending on a frequency of the clock CLK. The first and second node voltages Va/Vb_CA corresponding to the command/address signal CA may repeatedly rise and fall depending on a frequency of the command/address signal CA. Likewise, the first and second node voltages Va/Vb_DATA corresponding to the data "DATA" may repeatedly rise and fall depending on a frequency of the data "DATA".

The receiver 180 may generate a restored clock CLK_r based on the first and second node voltages Va/Vb_CLK corresponding to the clock CLK. The receiver 180 may generate a restored command/address CA_r based on the first and second node voltages Va/Vb_CA corresponding to the command/address signal CA. Likewise, the receiver 180 may generate restored data DATA_r based on the first and second node voltages Va/Vb_DATA corresponding to the data "DATA".

As illustrated in FIG. 11, frequencies of the restored signals may be identical to frequencies of signals input to the memory device 100. In this case, the restored signals may be delayed due to the influence of signal transmission lines and circuits.

As described above, the memory device 100 of the inventive concepts may receive high-frequency signals and may transmit the received signals to internal circuits of the memory device 100 through the driver 170 and the receiver 180. The memory device 100 may receive signals through pads placed at a periphery thereof and may transmit the received signals to a logic circuit placed at the center of the memory device 100 through signal lines above a memory cell array. In this case, since signal lines do not include an inverter or a repeater and a received signal is transmitted in the form of a differential small-swing signal, the memory device 100 may implement high-frequency communication with a small delay time and low power without an increase in the area.

Figure 12:
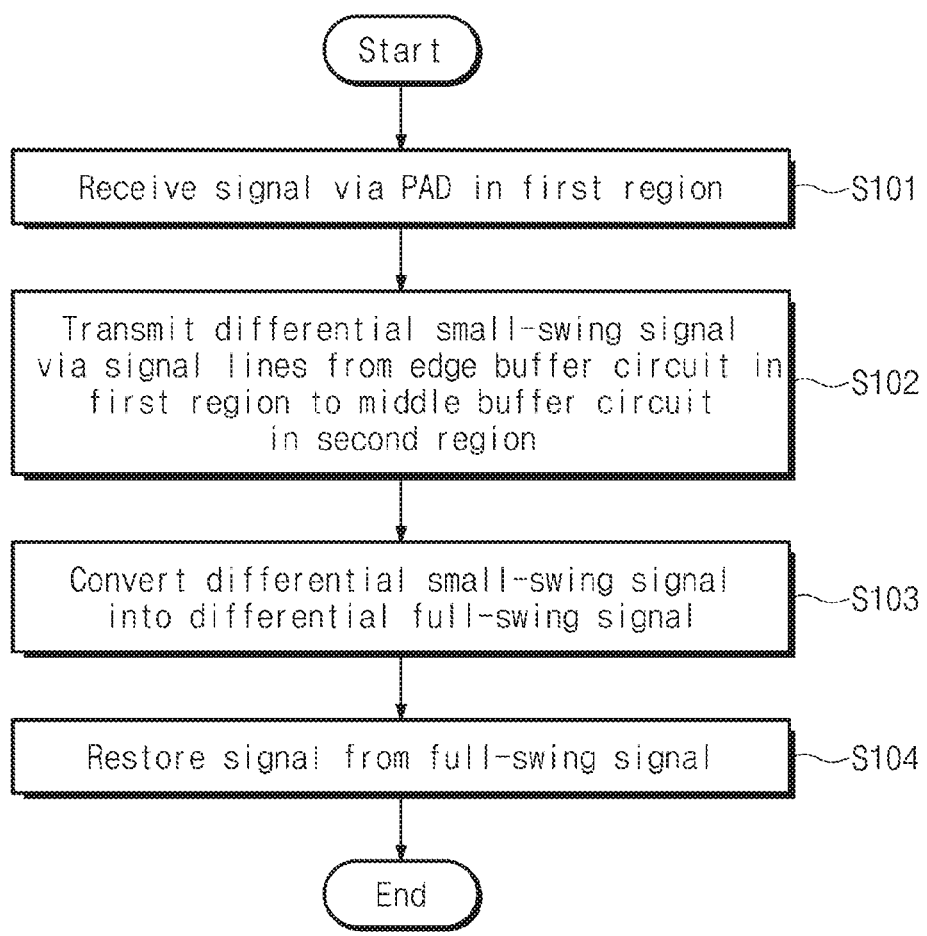
FIG. 12 is a flowchart illustrating a signal transmission method of a memory device of FIG. 2, according to at least one example embodiment.

FIG. 12 is a flowchart illustrating a signal transmission method of a memory device of FIG. 2, according to at least one example embodiment. Referring to FIGS. 2 and 12, in operation S101, the memory device 100 may receive a signal through a pad 130 in the first region. The first region may be placed at a periphery of the memory device 100.

In operation S102, the memory device 100 may transmit a differential small-swing signal from an edge buffer circuit 140 in the first region to a middle buffer circuit 150 in the second region through signal lines (e.g., the first signal line L1 and the second signal line L2). The differential small-swing signal may correspond to the signal received through the pad 130 in operation S101. The second region may be placed at the center of the memory device 100.

In operation S103, the memory device 100 may convert the differential small-swing signal to the differential full-swing signal. In operation S104, the memory device 100 may restore the signal from the converted full-swing signal.

Figure 13:
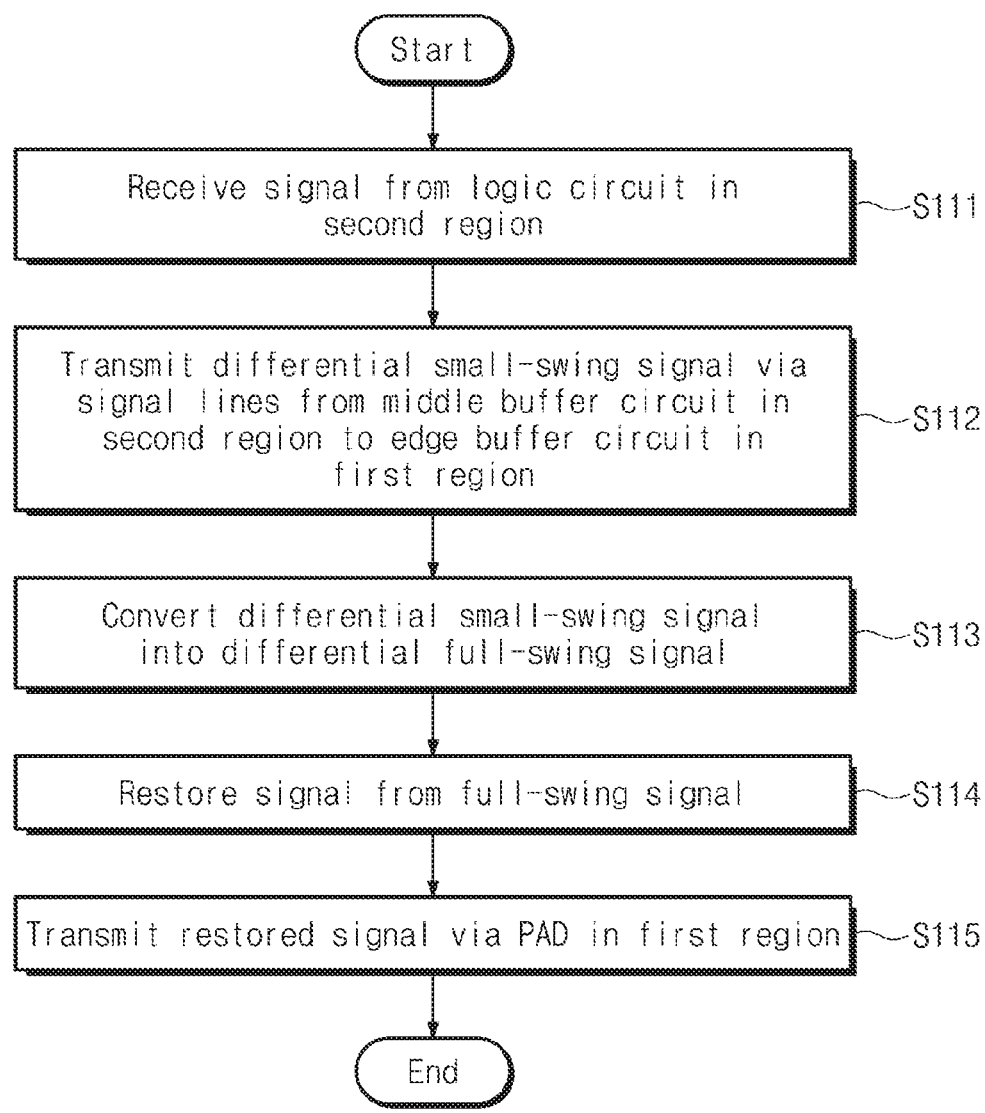
FIG. 13 is a flowchart illustrating a signal transmission method of a memory device of FIG. 2, according to at least one example embodiment.

FIG. 13 is a flowchart illustrating a signal transmission method of a memory device of FIG. 2, according to at least one example embodiment. Referring to FIGS. 2 and 12, in operation S111, the middle buffer circuit 150 in the second region may receive a signal from the logic circuit 160. The received signal may be a signal generated by the logic circuit 160 or a signal transmitted from the memory cell array 110.

In operation S112, the memory device 100 may transmit a differential small-swing signal from the middle buffer circuit 150 in the second region to the edge buffer circuit 140 in the first region through signal lines (e.g., the first signal line L1 and the second signal line L2). The differential small-swing signal may correspond to the signal received in operation S111.

In operation S113, the memory device 100 may convert the differential small-swing signal to the differential full-swing signal. In operation S114, the memory device 100 may restore the signal from the converted full-swing signal. In operation S115, the memory device 100 may store the restored signal to the outside through a pad in the first region.

Figure 14:
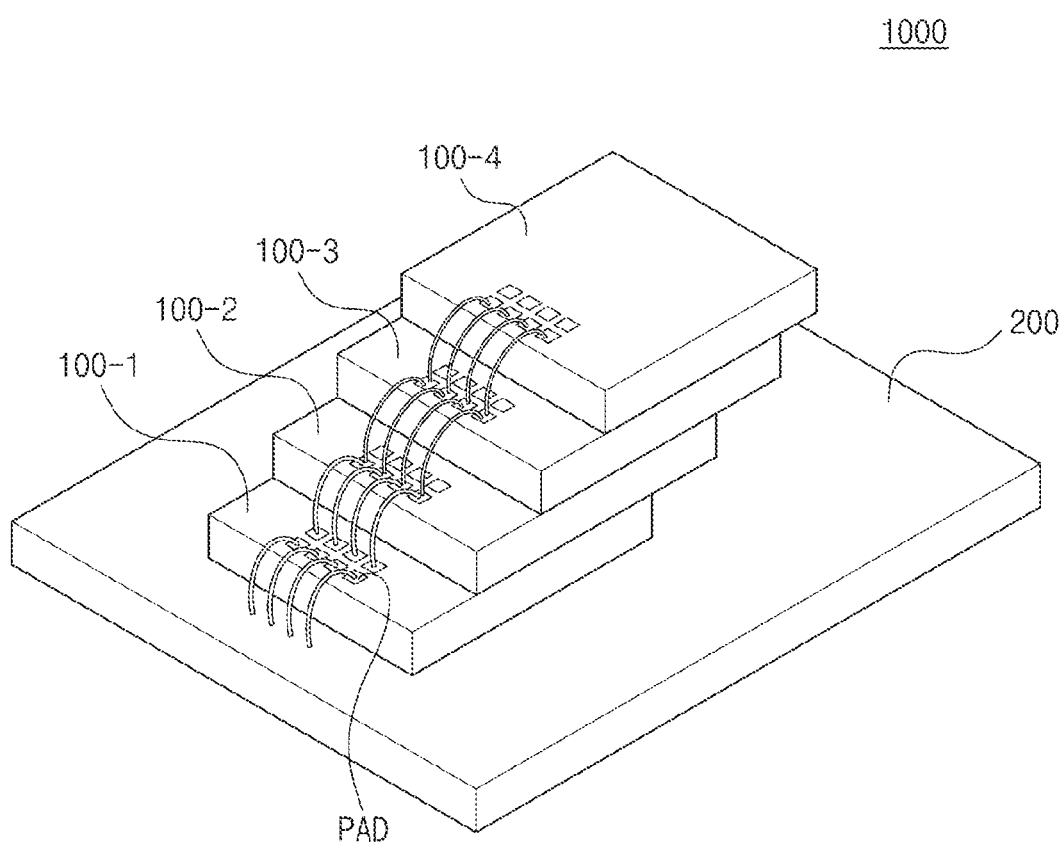
FIG. 14 is a diagram illustrating a memory system according to at least one example embodiment.

FIG. 14 is a diagram illustrating a memory system according to at least one example embodiment. Referring to FIG. 14, a memory system 1000 may include a board 200 and first to fourth memory devices 100-1 to 100-4. For example, the board 200 may be a printed circuit board (PCB). Each of the first to fourth memory devices 100-1 to 100-4 may include the memory device 100 described with reference to FIGS. 1 to 13. Thus, additional description will be omitted to avoid redundancy.

As illustrated in FIG. 14, the first to fourth memory devices 100-1 to 100-4 may be stacked on the board 200 in a stepped manner. The board 200 and the first to fourth memory devices 100-1 to 100-4 may be connected through wire bonding. Pads PAD of the first memory device 100-1 may be connected with the board 200 through the wire bonding, and pads PAD of the second memory device 100-2 may be connected with the first memory device 100-1 through the wire bonding. Likewise, the third memory device 100-3 may be connected with the second memory device 100-2 through the wire bonding, and the fourth memory device 100-4 may be connected with the third memory device 100-3 through the wire bonding.

Through a plurality of pads PAD, each of the first to fourth memory devices 100-1 to 100-4 may receive signals from the outside or may transmit signals to the outside. For example, in the case where a signal is transmitted from the outside to the second memory device 100-2, the board 200 may transmit the signal from the first memory device 100-1 through the pad "PAD" of the first memory device 100-1, and the first memory device 100-1 may transmit the signal to the second memory device 100-2 through the pad "PAD" of the second memory device 100-2. The signal transmitted to the second memory device 100-2 may be transmitted to the logic circuit 160 of the second memory device 100-2 through the method described with reference to FIGS. 1 to 13.

In some example embodiments, the first memory device 100-1 may be a master memory device, and the second to fourth memory devices 100-2 to 100-4 may be slave memory devices. The first memory device 100-1 may communicate with the board 200 and the second memory device 100-2. A pad "PAD" of the first memory device 100-1 used for communication with the board 200 may be different from the pad "PAD" of the first memory device 100-1 used for communication with the second memory device 100-2. The second to fourth memory devices 100-2 to 100-4 may communicate with any other memory devices through the same pads PAD.

The memory system 1000 is illustrated in FIG. 14 as including the first to fourth memory devices 100-1 to 100-4. However, the inventive concepts are not limited thereto. The memory system 1000 of the inventive concepts may include various numbers and configurations of memory devices.

As described above, in the case where a signal is transmitted within the memory device 100, the driver 170 and the receiver 180 may be used. However, the inventive concepts are not limited thereto. When a signal is transmitted within an electronic device, which may be implemented in various forms, as well as the memory device 100, the driver 170 and the receiver 180 may be used.

Figure 15:
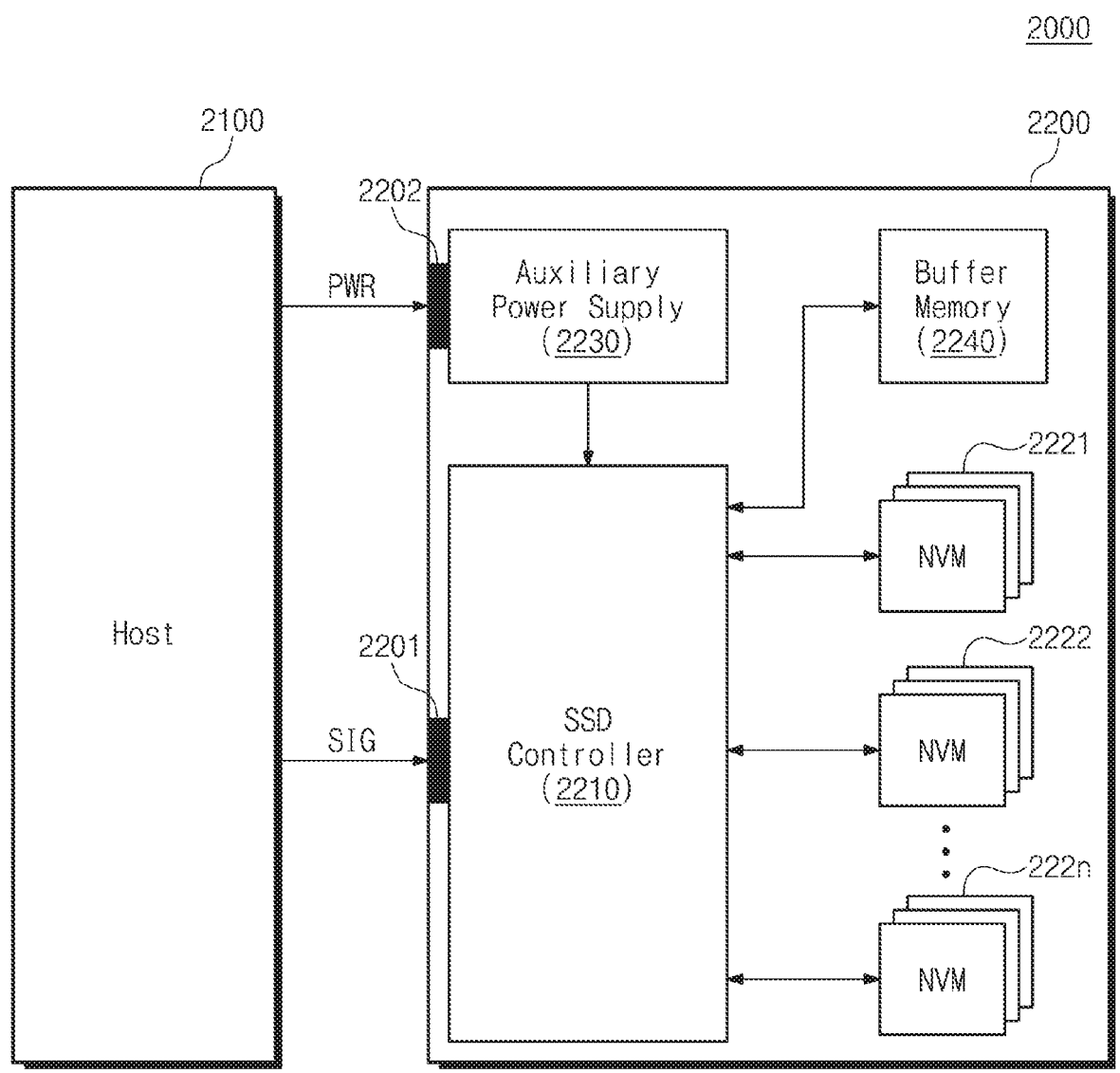
FIG. 15 is a block diagram illustrating a solid state drive (SSD) system to which at least one example embodiment is applied.

FIG. 15 is a block diagram illustrating a solid state drive (SSD) system to which at least one example embodiment is applied. Referring to FIG. 15, an SSD system 2000 may include a host 2100 and an SSD 2200.

The SSD 2200 may exchange signals SIG with the host 2100 through a signal connector 2201 and may be supplied with a power PWR through a power connector 2202. The SSD 2200 may include an SSD controller 2210, a plurality of flash memories 2221 to 222n, an auxiliary power supply 2230, and a buffer memory 2240.

The SSD controller 2210 may control the plurality of flash memories 2221 to 222n in response to the signals SIG received from the host 2100. The plurality of flash memories 2221 to 222n may operate under control of the SSD controller 2210.

The auxiliary power supply 2230 may be connected with the host 2100 through the power connector 2202. The auxiliary power supply 2230 may be charged by the power PWR from the host 2100. In the case where the power PWR is not smoothly supplied from the host 2100, the auxiliary power supply 2230 may provide the power of the SSD 2200.

The buffer memory 2240 may operate as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 222n. Alternatively, the buffer memory 2240 may temporarily store various information needed for the SSD controller 2210 to operate.

In some example embodiments, each of the SSD controller 2210, the buffer memory 2240, and the plurality of flash memories 2221 to 222n may include the driver 170 and the receiver 180 described with reference to FIGS. 1 to 13. Each of the SSD controller 2210, the buffer memory 2240, and the plurality of flash memories 2221 to 222n may operate the driver 170 and the receiver 180 for the purpose of receiving a signal from the outside and transmit the received signal to internal circuits.

In some example embodiments, the SSD controller 2210, the buffer memory 2240, and the plurality of flash memories 2221 to 222n may communicate with each other depending on the method described with reference to FIGS. 1 to 13.

Accordingly, in the case of transmitting signals through long signal lines, the SSD system 2000 may perform communication with a small delay time and low power.

According to a memory device of the inventive concepts, in the case of transmitting a signal through a relatively long signal line, it may be possible to transmit the signal with a small delay time and/or low power without an increase in the area of the memory device.

While the inventive concepts has been described with reference to some example embodiments thereof, it will be apparent to those of ordinary skill in the art that various changes and modifications may be made thereto without departing from the spirit and scope of the inventive concepts as set forth in the following claims.

What is claimed is:

1. A memory device comprising:
    a memory cell array including a plurality of memory cells;
    an edge buffer circuit in a first region adjacent to one side of the memory cell array and configured to receive an external signal through a pad; and
    a middle buffer circuit in a second region adjacent to an opposite side of the memory cell array and configured to receive a differential small-swing signal corresponding to the external signal from the edge buffer circuit through first and second signal lines above the memory cell array,
    wherein the edge buffer circuit is configured to drive the first and second signal lines based on the external signal such that the differential small-swing signal is transmitted to the middle buffer circuit.

2. The memory device of claim 1, wherein the edge buffer circuit comprises:
    a phase splitter configured to generate a first signal, a phase of which is identical to a phase of the external signal, and a second signal, a phase of which corresponds to an inverted phase of the external signal; and
    a push-pull driver configured to adjust a voltage magnitude of a first output node and a voltage magnitude of a second output node based on the first and second signals, to output the differential small-swing signal,
    wherein the first output node is connected with one end of the first signal line, and
    wherein the second output node is connected with one end of the second signal line.

3. The memory device of claim 2, wherein the edge buffer circuit further comprises:
    an enable control circuit configured to generate an enable signal for controlling an operation of the edge buffer circuit, based on the external signal and a delay signal obtained by delaying the external signal.

4. The memory device of claim 3, wherein, when the enable signal is set to logical high and the first signal is set to the logical high, the push-pull driver increases the voltage magnitude of the first output node and decreases the voltage magnitude of the second output node.

5. The memory device of claim 3, wherein, when the enable signal is set to logical high and the first signal is set to logical low, the push-pull driver decreases the voltage magnitude of the first output node and increases the voltage magnitude of the second output node.

6. The memory device of claim 3, wherein the edge buffer circuit further comprises:
a pre-charge circuit configured to pre-charge the first output node and the second output node to a voltage when the enable signal is set to logical low.

7. The memory device of claim 1, wherein the middle buffer circuit comprises:
a first differential amplifier configured to decrease either one of first and second output terminals of the middle buffer circuit to a ground voltage in response to the differential small-swing signal; and
a second differential amplifier configured to increase the other of the first and second output terminals to a power supply voltage in response to the differential small-swing signal.

8. The memory device of claim 7, wherein the middle buffer circuit is configured to restore the external signal based on a signal output from any one of the first and second output terminals.

9. The memory device of claim 8, further comprising:
a logic circuit in the second region and configured to control the memory cell array,
wherein the middle buffer circuit is configured to transmit the restored external signal to the logic circuit.

10. The memory device of claim 1, wherein the pad is connected with a printed circuit board (PCB) or another memory device through a wire bonding, and
wherein the memory device is stacked on the printed circuit board or the another memory device in a stepped manner.

11. The memory device of claim 1, wherein the first and second signal lines are free from an inverter or a repeater.

12. A memory system comprising:
a first memory device; and
a second memory device stacked on the first memory device and connected with the first memory device through a wire bonding,
wherein at least one of the first memory device or the second memory device includes:
a memory cell array including a plurality of memory cells;
an edge buffer circuit in a first region adjacent to one side of the memory cell array and configured to receive an external signal; and
a middle buffer circuit in a second region adjacent to an opposite side of the memory cell array and configured to receive a differential small-swing signal corresponding to the external signal from the edge buffer circuit through first and second signal lines above the memory cell array,
wherein the edge buffer circuit is configured to drive the first and second signal lines based on the external signal such that the differential small-swing signal is transmitted to the middle buffer circuit.

13. The memory system of claim 12, wherein a pad of the first memory device is connected with a pad of the second memory device through the wire bonding, and
wherein the first memory device and the second memory device are stacked in a stepped manner.

* * * * *